US009924587B2

(12) United States Patent
Belchenko et al.

(10) Patent No.: US 9,924,587 B2
(45) Date of Patent: *Mar. 20, 2018

(54) NEGATIVE ION-BASED NEUTRAL BEAM INJECTOR

(71) Applicant: TRI ALPHA ENERGY, INC., Foothill Ranch, CA (US)

(72) Inventors: Yuri I. Belchenko, Novosibirsk (RU); Alexander V. Burdakov, Novosibirsk (RU); Vladimir I. Davydenko, Novosibirsk (RU); Gennady I. Dimov, Novosibirsk (RU); Alexandr A. Ivanov, Novosibirsk (RU); Valeery V. Kobets, Novosibirsk (RU); Artem N. Smirnov, Foothill Ranch, CA (US); Michl W. Binderbauer, Ladera Ranch, CA (US); Donald L. Sevier, Fallbrook, CA (US); Terence E. Richardson, Encinitas, CA (US)

(73) Assignee: TAE TECHNOLOGIES, INC., Foothill Ranch, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/415,652

(22) Filed: Jan. 25, 2017

(65) Prior Publication Data

US 2017/0135194 A1 May 11, 2017

Related U.S. Application Data

(63) Continuation of application No. 14/637,231, filed on Mar. 3, 2015, now Pat. No. 9,591,740, which is a (Continued)

(51) Int. Cl.
*G21K 1/093* (2006.01)
*G21K 1/08* (2006.01)
(Continued)

(52) U.S. Cl.
CPC .................................... *H05H 3/02* (2013.01)

(58) Field of Classification Search
None
See application file for complete search history.

(56) References Cited

U.S. PATENT DOCUMENTS 4,439,395 A 3/1984 Kim
4,588,955 A * 5/1986 Anderson ................ G21K 1/08 250/423 R (Continued)

FOREIGN PATENT DOCUMENTS

AU 2013312795 8/2016
EA 201590506 3/2017

(Continued)

OTHER PUBLICATIONS

Takeir, Yasuhiko, Negative Ion Source Development for Fusion Application, 2010, National Institute for Fusion Science, 02B114-02B114-7.*

(Continued)

*Primary Examiner* — Dedei K Hammond
(74) *Attorney, Agent, or Firm* — One LLP

(57) ABSTRACT

A negative ion-based neutral beam injector comprising a negative ion source, accelerator and neutralizer to produce about a 5 MW neutral beam with energy of about 0.50 to 1.0 MeV. The ions produced by the ion source are pre-accelerated before injection into a high energy accelerator by an electrostatic multi-aperture grid pre-accelerator, which is used to extract ion beams from the plasma and accelerate to some fraction of the required beam energy. The beam from the ion source passes through a pair of deflecting magnets, which enable the beam to shift off axis before entering the high energy accelerator. After acceleration to full energy, the beam enters the neutralizer where it is partially converted into a neutral beam. The remaining ion species are separated
(Continued)

by a magnet and directed into electrostatic energy converters. The neutral beam passes through a gate valve and enters a plasma chamber.

22 Claims, 16 Drawing Sheets

Related U.S. Application Data continuation of application No. PCT/US2013/058093, filed on Sep. 4, 2013.

(60) Provisional application No. 61/775,444, filed on Mar. 8, 2013.

(51) Int. Cl.

| | |
|---|---|
| ***G21K 1/14*** | (2006.01) |
| ***H05H 5/06*** | (2006.01) |
| ***H01J 27/02*** | (2006.01) |
| ***H01J 37/08*** | (2006.01) |
| ***H05H 3/02*** | (2006.01) |

(56) References Cited

U.S. PATENT DOCUMENTS

| | | | |
|---|---|---|---|
| 4,812,775 A | 3/1989 | Klinkowstein et al. | |
| 4,960,990 A | 10/1990 | Lavan et al. | |
| 5,581,156 A * | 12/1996 | Roberts | H01J 27/18 250/423 F |

FOREIGN PATENT DOCUMENTS

| | | |
|---|---|---|
| EA | 201590506 | 7/2017 |
| EP | 13765855 | 2/2017 |
| EP | 13765855.5 | 9/2017 |
| JP | 2000-075075 | 3/2000 |
| JP | 2002-022870 | 1/2002 |
| JP | 2005-116312 | 4/2005 |
| JP | 2015-530153 | 3/2017 |
| MX | MX/a/2015/002783 | 5/2016 |
| NZ | 705667 | 9/2016 |
| NZ | 705667 | 3/2017 |
| NZ | 705667 | 6/2017 |
| RU | 2012137795 | 8/2016 |
| RU | 2610147 C1 | 2/2017 |
| UA | 2015 03114 | 7/2017 |
| WO | WO PCT/2013/058093 | 3/2014 |
| WO | WO PCT/2013/058093 | 3/2015 |

OTHER PUBLICATIONS

Alvarez, L. W., "Energy Doubling in D.C. Accelerators", University of California Radiation Lab, Uvrl-1249, Contract No. W-7405-eng-48, Apr. 20, 1951, pgs. 1-5.

Bacal, M., et al., "vol. Production Negative Hydrogen Ion Sources", IEEE Transactions on Plasma Science, 2005, vol. 33, No. 6, pgs. 1845-1871.

Beaumont, B., et al., "Design and R&D for the Heating Systems", Proceedings of the Iter — the International Seminar, Aix-en-Provence, Feb. 2007, pgs. 71-82.

Belchenko, Y. I., et al., "A Powerful Injector of Neutrals With a Surface-Plasma Source of Negative Ions", Nuclear Fusion, 1974, vol. 14, No. 1, pgs. 113114.

Belchenko, Y., "Surface negative ion production in ion sources", Rev. Sci. Instrum., 1993, vol. 64, No. 6, pgs. 1385-1393.

Belchenko, Y. I., et al., "Multiampere negative ion source development at Novosibirsk (invited)", Rev. Sci. Instrum., 19996, vol. 67, No. 3, pgs. 1108-1113.

Capitelli, M., et al., "Open Problems in the Physics of vol. H- / D- Sources", IEEE Transactions on Plasma Science, 2005, vol. 33, No. 6, pgs. 1832-1844.

Ehlers, K. W., "Multicusp negative ion source", Rev. Sci. Instrum., 1980, vol. 51, No. 6, pgs. 721-727.

Han, B.X., et al., "Low-energy beam transport studies supporting the spallation neutron source 1-Mw beam operation", Review of Scientific Instruments, 2012, vol. 83, No. 2, pgs.

Hemsworth, R. S., et al., "Neutral Beams for ITER (invited) a)", Rev. Sci. Instrum., 1996, vol. 67, No. 3, pp. 1120-1125.

Hemsworth, R. S., et al., "Positive and Negative Ion Sources for Magnetic Fusion", IEEE Transactions on Plasma Science, 2005, vol. 33, No. 6, pp. 1799-1813.

Ikeda, K., et al., "Recent Progress of Neutral Beam Injector and Beam Emission Diagnosis in LHD", Plasma Science and Technology, 2009, vol. 11, No. 4, pp. 452-455.

Kaneko, O., et al., "Engineering prospects of negative-ion-based neutral beam injection system from high power operation for the large helical device", Nuclear Fusion, 2003, vol. 43, No. 8, pp. 692-699.

Keller, R., "Ion-Source and Low-Energy Beam-Transport Issues for H Accelerators", Proceedings of the 1999 Particle Accelerator Conference, New York, 1999, pp. 87-91.

Marcuzzi, D., et al., "Detailed design of the RF source for the 1 MV neutral beam test facility", Fusion Engineering and Design, 2009, vol. 84, pp. 1253-1258.

Okumura, Y., et al., "Cesium Mixing in the Multi-Ampere vol. H- Ion Source", AIP Conference Proceedings, 1990, vol. 210, pp. 169-183.

Peters, J., "Negative ion sources for high energy accelerators (invited)", Rev. Sci. Instrum., 2000, vol. 71, No. 2, pp. 1069-1074.

Rasser, B., et al., "Theoretical Models of the Negative Ionization of Hydrogen on Clean Tungsten, Cesiated Tungsten and Cesium Surfaces At Low Energies", Surface Science, 1982, vol. 118, pp. 697-710.

Seidl, M., et al., "Negative surface ionization of hydrogen atoms and molecules", J. Appl. Phys., 1996, vol. 79, No. 6, pp. 2896-2901.

Simonin, a., et al., "Mirror-like plasma confinement for a uniform large negative ion source", Nuclear Fusion, 2012, vol. 52, No. 6, pp. 1-7.

Takeiri, Y., et al., "Characteristics of long-pulse negative-ion source in the neutral beam injector of Large Helical Device", Rev. Sci. Instrum., 2006, vol. 77, pp. 03A523-1-03A523-4.

Takeiri, Y., "Negative ion source development for fusion application (invited)", Review of Scientific Instruments, 2010, vol. 81, No. 2, pp. 02B114-1—026114-7.

Tsumori, K., et al., "Stability of High Power Beam Injection in Negative-Ion-Based LHD-NBI", AIP Conf. Proceedings 1390, Second International Symposium on Negative Ions, Beams and Sources, Takayama City, Japan, Sep. 2011, pp. 517-525.

Vollmer, O., et al., "Development of large radio frequency driven negative ion sources for fusion", Rev. Sci. Instrum., 2000, vol. 71, No. 2, pp. 939-942.

Anderson, O. A., et al., "Low-energy injector design for SSC", Rev. Sci. Instrum., vol. 63, No. 4, 1992, pp. 2738-2740.

Inoue, T., et al., "A merging preaccelerator for high current H- ion beams", Rev. Sci. Instrum., 1995, vol. 66, No. 7, pp. 3859-3863.

Arnaudon, L., et al., "Linac4 Technical Design Report", retrieved from https://cds.cern.ch/record/1004186/files/note-2006-022-HIPPI.pdf dated Oct. 27, 2017.

* cited by examiner

NEGATIVE ION-BASED NEUTRAL BEAM INJECTOR

CROSS-REFERENCE TO RELATED APPLICATIONS

The subject application is a continuation of U.S. patent application Ser. No. 14/637,231, filed Mar. 3, 2015, which is a continuation of International Application No. PCT/US2013/058093, filed on Sep. 4, 2013, which claims priority to U.S. Provisional Patent Application No. 61/775,444, filed on Mar. 8, 2013, all of which are incorporated by reference herein in their entirety for all purposes.

FIELD

The subject matter described herein relates generally to neutral beam injectors and, more particularly, to a neutral beam injector based on negative ions.

BACKGROUND

Until quite recently, the neutral beams used in magnetic fusion research, material processing, etching, sterilization and other applications were all formed from positive ions. Positive hydrogen isotope ions were extracted and accelerated from gas discharge plasma by electrostatic fields. Immediately after the ground plane of the accelerator, they entered a gas cell, where they underwent both charge exchange reactions to acquire an electron and impact ionization reactions to lose it again. Because the charge exchange cross section falls much more rapidly with increasing energy than does the ionization cross section, the equilibrium neutral fraction in a thick gas cell begins to drop rapidly at energies greater than 60 keV for hydrogen particles. For hydrogen isotope neutral beam applications requiring energies appreciably higher than this, it is necessary to produce and accelerate negative ions, and to then convert them to neutrals in a thin gas cell, which can result in a neutral fraction of about 60% across a wide range of energies up to many MeVs. Even higher neutral fractions can be obtained if a plasma or photon cell is used to convert energetic negative ion beams to neutrals. In the case of a photon cell, for which photon energy exceeds electron affinity of hydrogen, neutral fractions could be close to 100%. It is worthwhile to note that the first time the idea of the application of negative ions in accelerator physics was stated by Alvarez more than 50 years ago [1].

Since neutral beams for current drive and heating on larger fusion devices of the future, as well as some applications on present-day devices, require energies well beyond that accessible with positive ions, negative-ion-based neutral beams were developed in recent years. However, beam currents achieved so far are significantly less than that produced quite routinely by positive ion sources. A physical reason for the lower performance of negative ion sources in terms of beam current is the low electron affinity of hydrogen, which is only 0.75 eV. Therefore, it is much more difficult to produce negative hydrogen ions than their positive counterparts. It is also quite difficult for newly born negative ions to reach an extraction region without collisions with energetic electrons which, with very high probability, will cause the loss of the extra loosely bound electron. Extracting $H^-$ ions from plasma to form a beam is likewise more complicated than with $H^+$ ions, since the negative ions will be accompanied by a much larger current of electrons unless suppression measures are employed. Since the cross section for collisional stripping of the electron from an $H^-$ ion to produce an atom is considerably greater than the cross section for an $H^+$ ion to acquire an electron from a hydrogen molecule, the fraction of ions converted to neutrals during acceleration can be significant unless the gas line density in the accelerator path is minimized by operating the ion source at a low pressure. Ions prematurely neutralized during acceleration form a low energy tail, and generally have greater divergence than those which experience the full acceleration potential.

Neutralization of the accelerated negative ion beam can be done in a gas target with an efficiency of about 60%. The usage of plasma and photon targets allows for the further increase in the neutralization efficiency of negative ions. Overall energy efficiency of the injector can be increased by recuperation of the energy of the ion species remaining in the beam after passing a neutralizer.

The schematic diagram of a high-power neutral beam injector for the ITER tokomak, which is also typical for other reactor-grade magnetic plasma confinement systems under consideration, is shown in FIG. 3 [2]. The basic components of the injector are a high-current source of negative ions, an ion accelerator, a neutralizer, and a magnetic separator of the charged component of the charge-exchanged beam with ion collectors-recuperators.

In order to sustain the required vacuum conditions in the injector, a high vacuum pumping system typically is used with large size gate valves cutting the beam duct from the plasma device and/or providing access to major elements of the injector. The beam parameters are measured by using retractable calorimetric targets, as well as by non-invasive optical methods. Production of powerful neutral beams requires a corresponding power supply to be used.

According to the principle of production, the sources of negative ions can be divided into the following groups:

- volume production (plasma) sources—in which ions are produced in the volume of plasma;
- surface production sources—in which ions are produced on the surface of electrodes or special targets;
- surface-plasma sources—in which ions are produced on the surfaces of electrodes interacting with plasma particles, which were developed by the Novosibirsk group [3]; and
- charge-exchange sources—in which negative ions are produced due to the charge-exchange of the accelerated positive ion beams on different targets.

To generate plasma in modern volume $H^-$ ion sources similar to that in the positive ion source, arc discharges with hot filaments or hollow cathodes are used, as well as RF discharges in hydrogen. For the improvement of electron confinement in the discharge and for the decrease of the hydrogen density in the gas-discharge chamber, which is important for negative ion sources, discharges in a magnetic field are used. The systems with an external magnetic field (i.e., with Penning or magnetron geometry of electrodes, with electron oscillation in the longitudinal magnetic field of the "reflective" discharge), and the systems with a peripheral magnetic field (multipole) are widely used. A cutaway view of the discharge chamber with a peripheral magnetic field developed for the neutral beam injector of JET is shown in FIG. 4 [3]. A magnetic field at the periphery of the plasma box is produced by permanent magnets installed on its outer surface. The magnets are arranged in rows in which magnetization direction is constant or changes in staggered order, so that magnetic field lines have geometry of linear or checkerboard cusps near the wall.

Application of the systems with a multipole magnetic field at the periphery of the plasma chambers in particular, allows the systems to maintain a dense plasma in the source at the reduced gas working pressure in the chamber down to 1-4 Pa (without cesium) and down to 0.3 Pa—in the systems with cesium [4]. Such a reduction of hydrogen density in the discharge chamber is particularly important for high current multi-aperture giant ion sources which are being developed for applications in fusion research.

At the moment, surface plasma production ion sources are considered the most suitable for production of high current negative ion beams.

In surface plasma production ion sources the ions are produced in interaction between particles having sufficient energy and a low work function surface. This effect can be enhanced by alkali coating of the surface exposed to the bombardment. There are two principal processes, namely the thermodynamic-equilibrium surface ionization, where the slow atom or molecule impinging on the surface is emitted back as a positive or negative ion after a mean residence time, and the non-equilibrium (kinetic) atom-surface interaction, where negative ions are produced by sputtering, impact desorption (in contrast to thermal desorption where the thermal particles are desorbed) or reflection in the presence of an alkali metal coating. In the process of the thermodynamic-equilibrium ionization the adsorbed particles come off the surface in the conditions of thermal equilibrium. The ionization coefficient of the particles leaving the surface is determined by the Saha formula and appears to be very small ~0.02%.

The process of non-equilibrium kinetic surface ionization appears to be much more effective in the surface and has a low enough work function comparable to electron affinity of the negative ion. During this process, the negative ion comes off the surface overcoming the near surface barrier using kinetic energy acquired from the primary particle. Near the surface an energy level of the additional electron is lower than the upper Fermi level of the electrons in metal and this level can be very easily occupied by electron tunneling from metal. During ion movement off the surface it overcomes a potential barrier produced by image charge $$U_{image} = -\frac{e^2}{4x}.$$

The field of the charge image heightens the energy level of the additional electron relative to the energy levels of the electrons in metal. Starting from some critical distance, the level of the additional electron becomes higher than the upper energy level of the electrons in the metal, and resonance tunneling returns back the electron from the leaving ion back to the metal. In case the particle is coming off fast enough, the coefficient of negative ionization appears to be quite high for the surface with low work function which can be provided by covering an alkali metal, especially cesium.

It is experimentally shown that the degree of negative ionization of hydrogen particles coming off this surface with a lowered work function may reach $$\beta^- = \frac{j^-}{j^- + j^0 + j^+} = 0.67.$$

It is noted that the work function on tungsten surfaces has a minimum value with Cs coverage of 0.6 monolayers (on a tungsten crystal 110 surface).

For the development of negative hydrogen ion sources, it is important that the integral yield of negative ions is sufficiently high, $K^-$=9-25%, for collisions of hydrogen atoms and positive ions with energies of 3-25 eV with surfaces with low work function, like Mo+Cs, W+Cs [5]. In particular, (see FIG. 5) in the bombardment of a cesiated molybdenum surface by Frank-Condon atoms with energy greater than 2 eV, the integral conversion efficiency into $H^-$ ions may reach $K^-$~8%.

In surface-plasma sources (SPSs) [3], the negative ion production is realized due to kinetic surface ionization—processes of sputtering, desorption or reflection on electrodes in contact with the gas-discharge plasma. The electrodes of special emitters with a lowered work function are used in SPSs for the enhancement of negative ion production. As a rule, the addition of a small amount of cesium into the discharge allows one to obtain a manifold increase in the luminosity and intensity of $H^-$ beams. Cesium seeding into the discharge remarkably decreases the accompanying flux of electrons extracted with the negative ions.

In an SPS, gas discharge plasma serves several functions, namely it produces intense fluxes of particles bombarding the electrodes; the plasma sheath adjacent to the electrode produces ion acceleration, thereby increasing the energy of the bombarding particles; negative ions, which are produced at electrodes under negative potential, are accelerated by the plasma sheath potential and come through the plasma layer into the extraction region without considerable destruction. An intense negative ion production with rather high power and gas efficiencies was obtained in various modifications of SPS under "dirty" gas-discharge conditions and an intense bombardment of the electrodes.

Several SPS sources have been developed for large fusion devices like LHD, JT-60U and the international (ITER) tokomak.

Typical features of these sources can be understood considering the injector of a LHD stellarator [4], which is shown in FIG. 6 [4, 6]. Arc plasma is produced in a large magnetic multipole bucket fence chamber with a volume of ~100 Liters. Twenty four tungsten filaments support the 3 kA, ~80 V arc under hydrogen pressure of about 0.3-0.4 Pa. An external magnet filter with a maximal field at center of ~50 G provides the electron density and temperature decrease in the extraction region near the plasma electrode. Positive bias of plasma electrode (~10 V) decreases an accompanying electron flux. Negative ions are produced on the plasma electrode covered by optimal cesium layer. External cesium ovens (three for one source) equipped with pneumatic valves supply the distributed cesium seeding. Negative ion production attains a maximum at optimal plasma electrode temperature of 200-250° C. The plasma electrode is thermally insulated and its temperature is determined by power loads plasma discharge.

A four electrode multi-aperture ion-optical system, which is used in the LHD ion source, is shown in FIG. 7 [6]. Negative ions are extracted through 770 emission apertures with a diameter of 1.4 cm each. The apertures occupy an area of 25×125 $cm^2$ on the plasma electrode. Small permanent magnets are embedded into the extraction grid between apertures to deflect the co-extracted electrons from the beam onto the extraction electrode wall. An additional electron suppression grid, installed behind the extraction grid suppressed the secondary electrons, backscattered or emitted from the extracted electrode walls. A multi-slit grounded grid with high transparency is used in the ion source. It decreases the beam intersection area thus improving the voltage holding capacity and lowering the gas pressure in the gaps by a factor of 2.5 with the corresponding reduction of the beam stripping losses. Both the extraction electrode and the grounded electrode are water-cooled.

Cesium seeding into the multi-cusp source provides a 5-fold increase of an extracted negative ion current and a linear growth of $H^-$ ions yield in the wide range of discharge powers and hydrogen filling pressures. Other important advantages of cesium seeding are a ~10-fold decrease of the co-extracted electron current and an essential decrease of hydrogen pressure in the discharge down to 0.3 Pa.

The multi-cusp sources at LHD routinely provide about a 30 A ion current each with current density of 30 mA/cm$^2$ in 2 second long pulses [6]. The main issues for the LHD ion sources is a blocking of cesium, which is seeded to the arc chamber, by the tungsten sputtered from filaments and the decrease of high voltage holding capacity when operated in the high-power long pulse regime.

The negative-ion-based neutral beam injector of the LHD has two ion sources operated with hydrogen at nominal beam energy of 180 keV. Every injector has achieved the nominal injection power of 5 MW during 128 sec pulse, so that each ion source provides a 2.5 MW neutral beam. FIGS. 8 A and B shows the LHD neutral beam injector. A focal length of the ion source is 13 m, and the pivot point of the two sources is located 15.4 m downstream. Injection port is about 3 m long with the narrowest part being 52 cm in diameter and 68 cm in length.

The ion sources with RF plasma drivers and negative ion production on a plasma electrode covered by cesium are under development at IPP Garching. The RF drivers produce more clean plasma, so that there is no cesium blocking by tungsten in these sources. Steady state extraction of a negative ion beam pulse with a beam current of 1 A, energy of ~20 kV and duration of 3600 seconds was demonstrated by IPP in 2011.

At present, high energy neutral beam injectors, which are under development for next phase fusion devices, such as, e.g., the ITER tokomak, have not demonstrated stable operation at a desired 1 MeV energy and steady state or continuous wave (CW) operation with high enough current. Therefore, there is a need to develop viable solutions whenever it is possible to resolve the problems preventing achievement of the target parameters of the beam, such as, e.g., beam energy in the range of 500-1000 KeV, effective current density in neutrals of the main vessel port of 100-200 A/m$^3$, power per neutral beam injector of about 5-20 MW pulse length of 1000 seconds, and gas loads introduced by the beam injector to be less than 1-2% of the beam current. It is noted that achievement of this goal becomes much less demanding if a negative ion current in a module of the injector is reduced down to a 8-10 A extracting ion current compared to a 40 A extracting ion current for the ITER beam. The stepping down in the extracted current and beam power would result in strong alterations in the design of the key elements of the injector ion source and the high energy accelerator, so that many more well developed technologies and approaches become applicable improving the reliability of the injector. Therefore, present consideration suggests the extracted current of 8-10 A per module, under assumption that the required output injection power can be obtained using several injector modules producing high current density, low divergent beams.

The surface plasma source performance is rather well documented and several ion sources now in operation have produced continuous scalable ion beams in excess of 1 A or higher. So far, key parameters of neutral beam injectors, like beam power and pulse duration, are quite far from those required for the injector under consideration. Current status of the development of these injectors can be understood from Table 1.

TABLE 1

| | TAE | ITER | JT-60U | LHD | IPP | CEA-JAERI |
|---|---|---|---|---|---|---|
| Current density (A/m$^2$) | | 200 $D^-$ 280 $H^-$ | 100 $D^-$ | 350 $H^-$ | 230 $D^-$ 330 $H^-$ | 216 $D^-$ 195 $H^-$ |
| Beam energy (keV) | 1000 $H^-$ | 1000 $D^-$ 100 $H^-$ | 365 | 186 | 9 | 25 |
| Pulse length (s) | ≥1000 | 3600 $D^-$ 3 $H^-$ | 19 | 10 | <6 | 5 1000 |
| Electron to ion ratio | | 1 | ~0.25 | <1 | <1 | <1 |
| pressure (Pa) | 0.3 | 0.3 | 0.26 | 0.3 | 0.3 | 0.35 |
| comments | | Combined numbers not yet achieved, experiments under way at IPP Garching - long pulse source MANITU now delivers 1 A/20 kV for up to 3600 s with $D^-$ | Filament source | Filament source | RF source, not full extraction, test bed known as BATMAN operated at 2 A/20 kV for ~6 s | KamabokoIII source (JAERI) on MANTIS (CEA) |

Therefore, it is desirable to provide an improved neutral beam injector.

SUMMARY OF INVENTION

Embodiments provided herein are directed to systems and methods for a negative ion-based neutral beam injector. The negative ion-based neutral beam injector comprises an ion source, an accelerator and a neutralizer to produce about a 5 MW neutral beam with energy of about 0.50 to 1.0 MeV.

The ion source is located inside a vacuum tank and produces a 9 A negative ion beam. The ions produced by the ion source are pre-accelerated to 120 keV before injection into a high energy accelerator by an electrostatic multi aperture grid pre-accelerator in the ion source, which is used to extract ion beams from the plasma and accelerate to some fraction of the required beam energy. The 120 keV beam from the ion source passes through a pair of deflecting magnets, which enable the beam to shift off axis before entering the high energy accelerator. After acceleration to full energy, the beam enters the neutralizer where it is partially converted into a neutral beam. The remaining ion species are separated by a magnet and directed into electrostatic energy converters. The neutral beam passes through a gate valve and enters a plasma chamber.

The plasma drivers and the internal walls of a plasma box of the ion source are maintained at elevated temperature (150-200° C.) to prevent cesium accumulation on their surfaces. A distributing manifold is provided to supply cesium directly onto the surface of the plasma grids and not to the plasma. This is in contrast to existing ion sources which supply cesium directly into a plasma discharge chamber.

A magnetic field used to deflect co-extracted electrons in ion extraction and pre-acceleration regions is produced by external magnets, not by magnets embedded into the grid body, as adopted in previous designs. The absence of embedded "low-temperature" magnets in the grids enables them to be heated up to elevated temperatures. Previous designs tend to utilize magnets embedded into the grid body, which tends to cause a significant reduction in extracted beam current and prevent elevated temperature operation as well as appropriate heating/cooling performance.

The high voltage accelerator is not coupled directly to the ion source, but is spaced apart from the ion source by a transition zone (low energy beam transport line—LEBT) with bending magnets, vacuum pumps and cesium traps. The transition zone intercepts and removes most of the co-streaming particles including electrons, photons and neutrals from the beam, pumps out gas emanating from the ion source and prevents it from reaching the high-voltage accelerator, prevents cesium from flowing out of the ion source and penetrating to the high-voltage accelerator, prevents electrons and neutrals, produced by negative ions stripping, from entering the high-voltage accelerator. In the previous designs, the ion source is directly connected to the high-voltage accelerator, which tends to cause the high-voltage accelerator to be subject to all gas, charged particle, and cesium flows from the ion source and vice versa.

The bending magnets in the LEBT deflect and focus the beam onto the accelerator axis and, thus compensate any beam offset and deflection during transport through the magnetic field of the ion source. The offset between the axes of pre and high-voltage accelerators reduces the influx of co-streaming particles to the high-voltage accelerator and prevents the highly accelerated particles (positive ions and neutrals) from back-streaming into the pre-accelerator and ion source. The beam focusing also facilitates homogeneity of the beam entering the accelerator compared to the multi-aperture grid systems.

The neutralizer includes a plasma neutralizer and a photon neutralizer. The plasma neutralizer is based on a multi-cusp plasma confinement system with high field permanent magnets at the walls. The photon neutralizer is a photon trap based on a cylindrical cavity with highly reflective walls and pumping with high efficiency lasers. These neutralizer technologies have never been considered for applications in large-scale neutral beam injectors.

Other systems, methods, features and advantages of the example embodiments will be or will become apparent to one with skill in the art upon examination of the following figures and detailed description.

BRIEF DESCRIPTION OF FIGURES

The details of the example embodiments, including structure and operation, may be gleaned in part by study of the accompanying figures, in which like reference numerals refer to like parts. The components in the figures are not necessarily to scale, emphasis instead being placed upon illustrating the principles of the invention. Moreover, all illustrations are intended to convey concepts, where relative sizes, shapes and other detailed attributes may be illustrated schematically rather than literally or precisely.

It should be noted that elements of similar structures or functions are generally represented by like reference numerals for illustrative purpose throughout the figures. It should also be noted that the figures are only intended to facilitate the description of the preferred embodiments.

DETAILED DESCRIPTION

Each of the additional features and teachings disclosed below can be utilized separately or in conjunction with other features and teachings to provide a new negative ion-based neutral beam injector. Representative examples of the embodiments described herein, which examples utilize many of these additional features and teachings both separately and in combination, will now be described in further detail with reference to the attached drawings. This detailed description is merely intended to teach a person of skill in the art further details for practicing preferred aspects of the present teachings and is not intended to limit the scope of the invention. Therefore, combinations of features and steps disclosed in the following detail description may not be necessary to practice the invention in the broadest sense, and are instead taught merely to particularly describe representative examples of the present teachings.

Moreover, the various features of the representative examples and the dependent claims may be combined in ways that are not specifically and explicitly enumerated in order to provide additional useful embodiments of the present teachings. In addition, it is expressly noted that all features disclosed in the description and/or the claims are intended to be disclosed separately and independently from each other for the purpose of original disclosure, as well as for the purpose of restricting the claimed subject matter independent of the compositions of the features in the embodiments and/or the claims. It is also expressly noted that all value ranges or indications of groups of entities disclose every possible intermediate value or intermediate entity for the purpose of original disclosure, as well as for the purpose of restricting the claimed subject matter.

Figure 1:
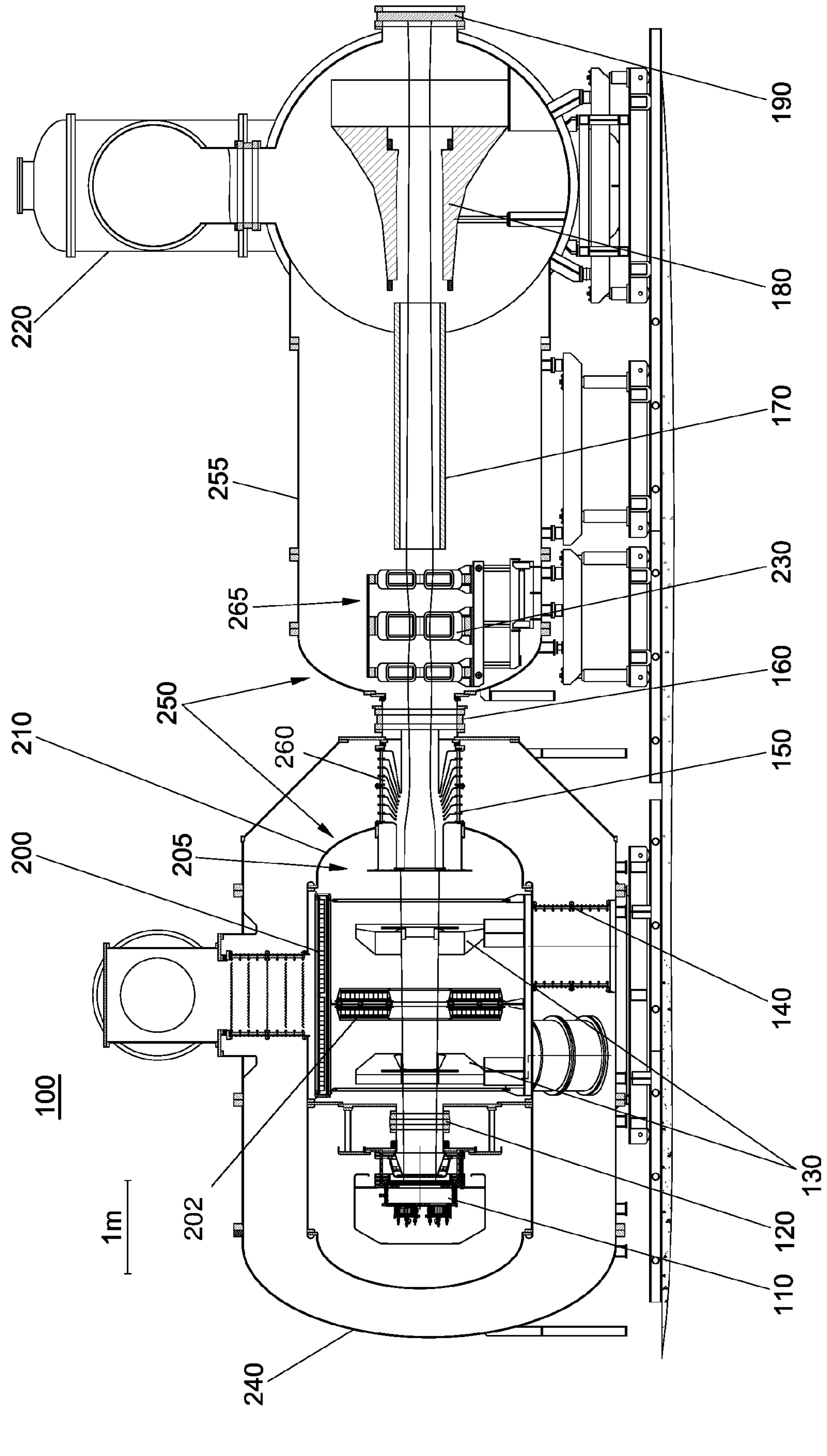
FIG. 1 is a plan view of a negative ion-based neutral beam injector layout.
Figure 2:
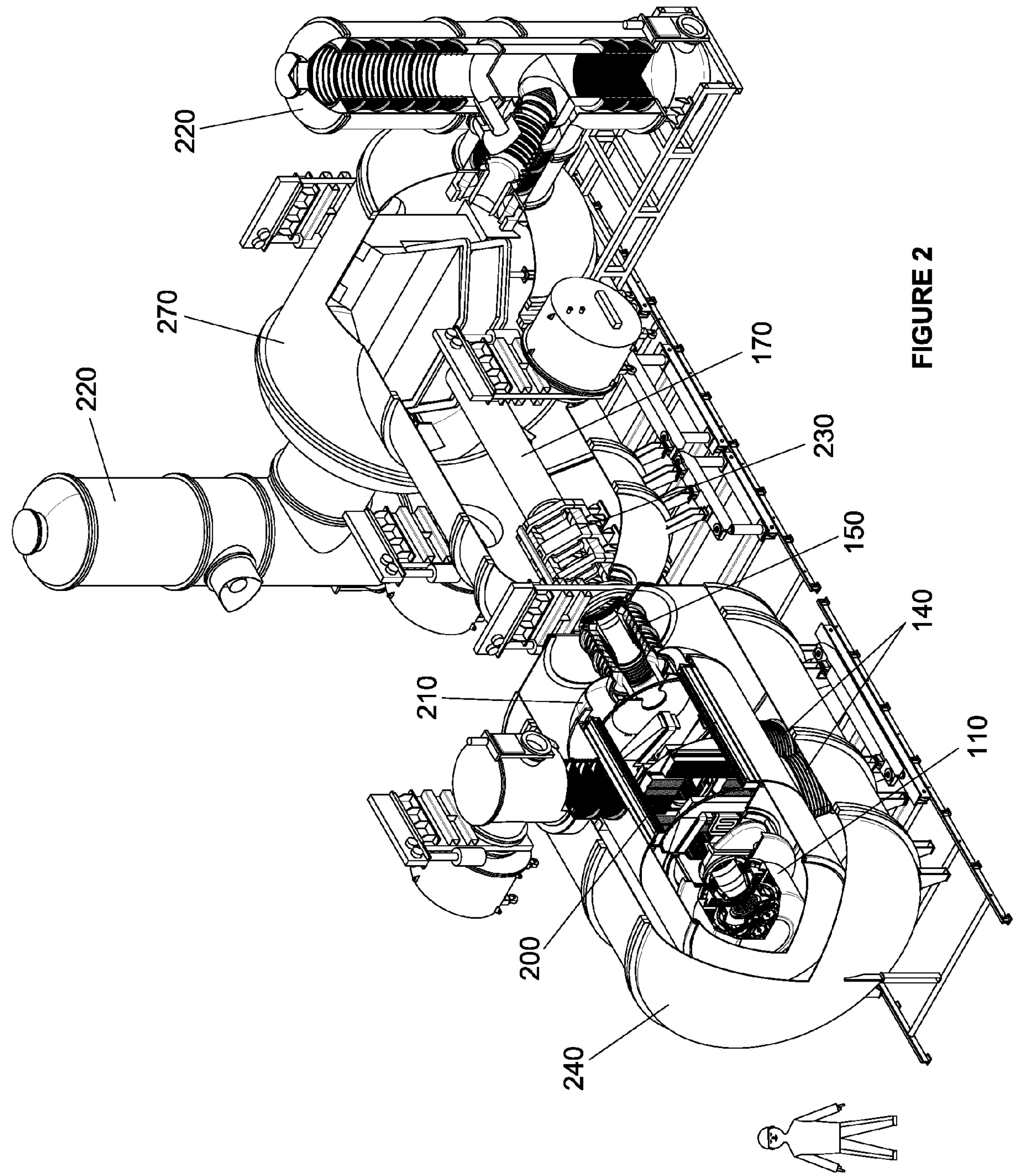
FIG. 2 is a sectional isometric view of the negative ion-based neutral beam injector shown in FIG. 1.
Figure 3:
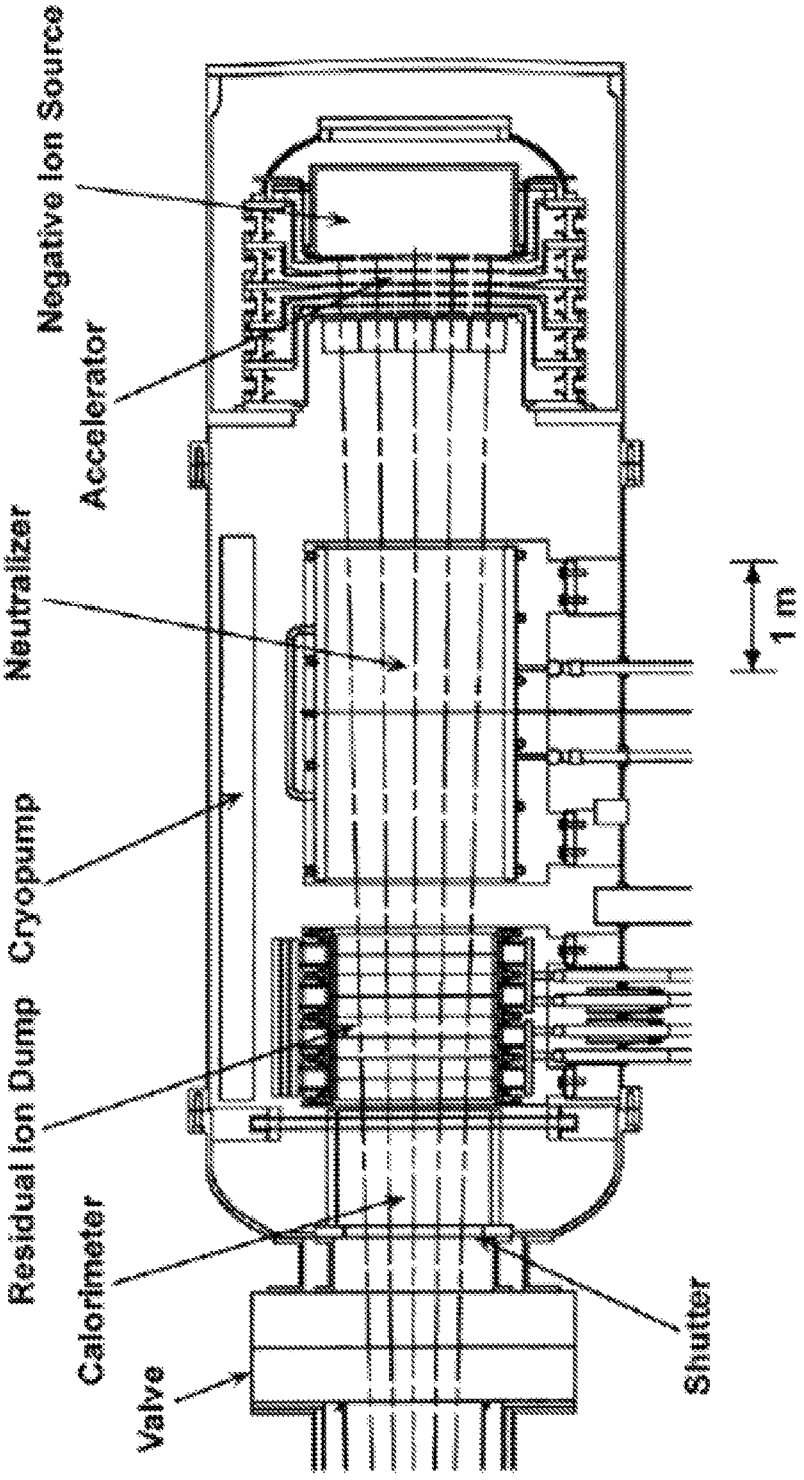
FIG. 3 is a plan view of a high-power injector of neutrals for the ITER tokomak.
Figure 4:
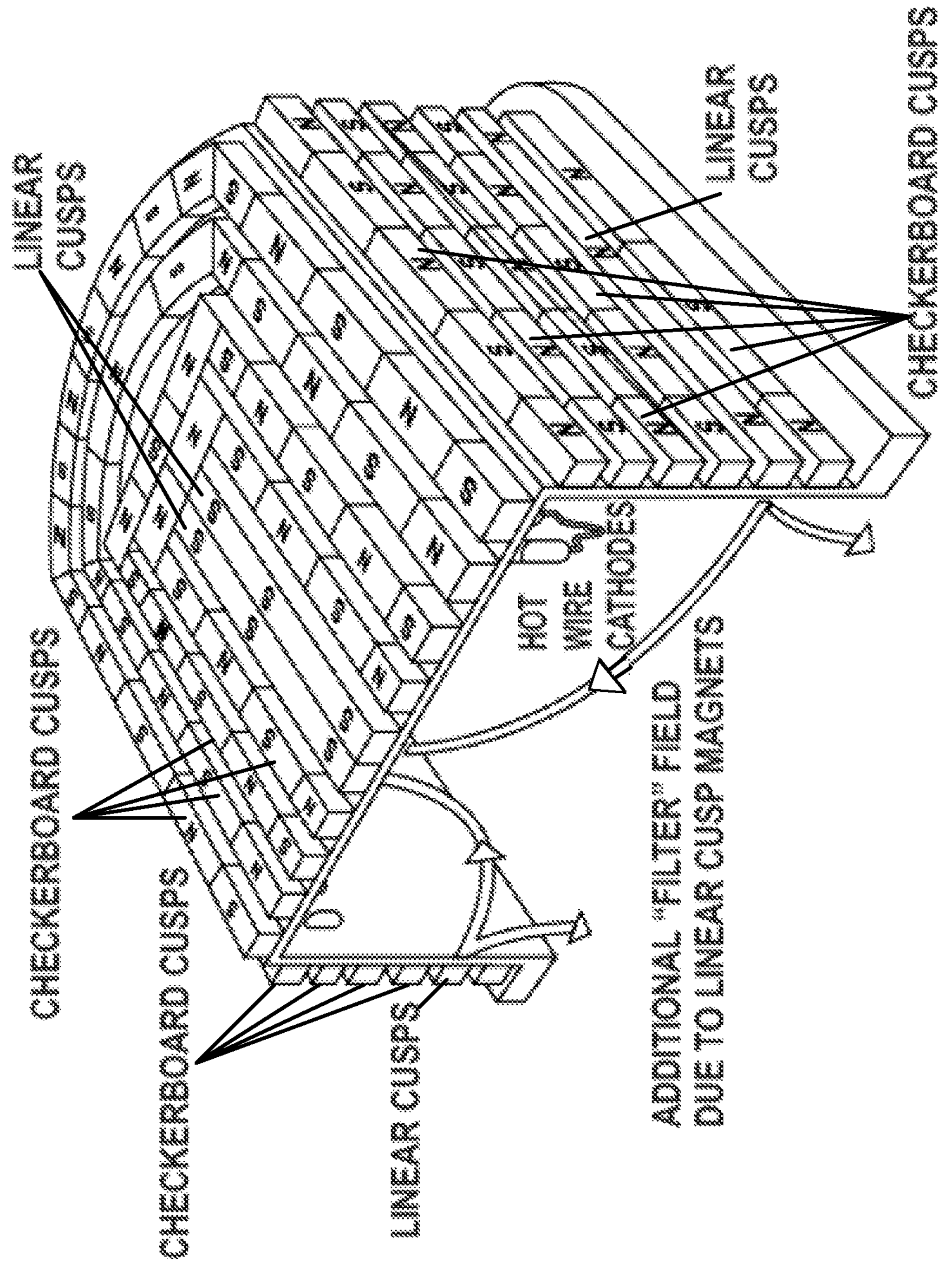
FIG. 4 is an isometric cut-away view of the discharge chamber with a peripheral multipole magnetic field for the JET neutral beam injector.
Figure 5:
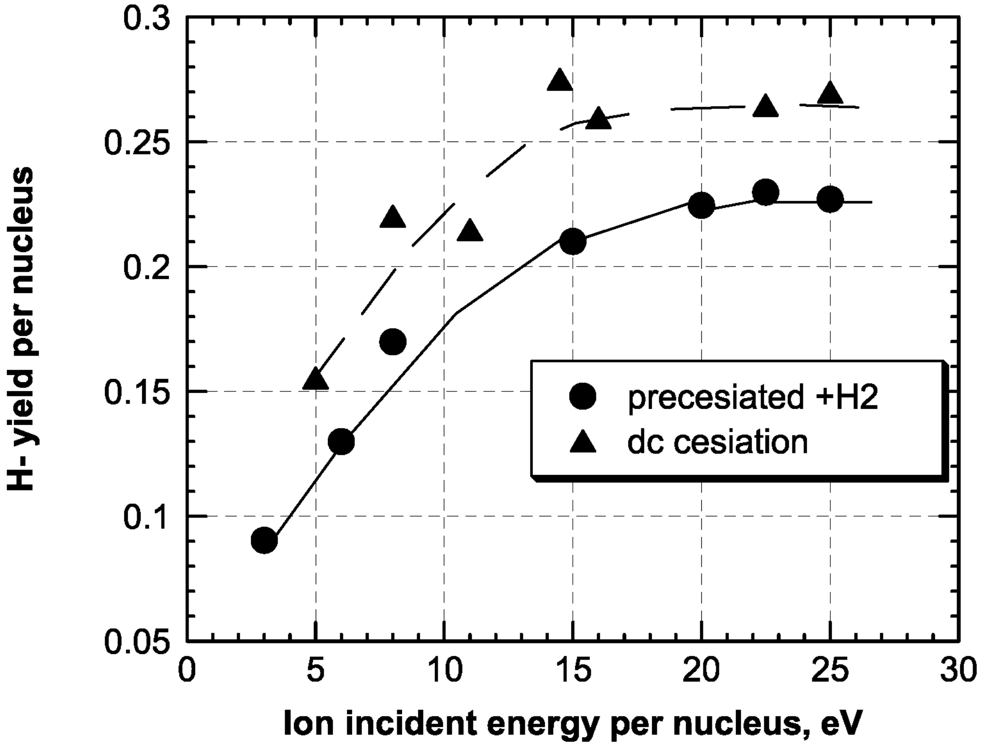
FIG. 5 is a chart showing the integral yield of negative ions formed by bombarding a Mo+Cs surface with neutral H atoms and positive molecular H as a function of incident energy. Yields are boosted by utilizing DC cesiation as compared to only precesiating the surface.
Figure 6:
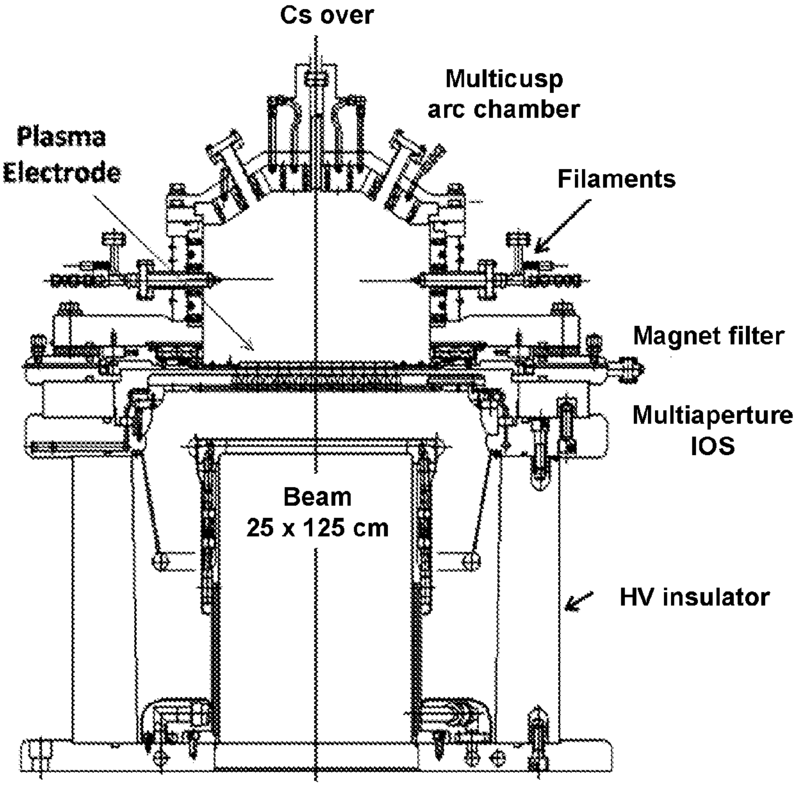
FIG. 6 is a plan view of a negative ion source for the LHD.
Figure 7:
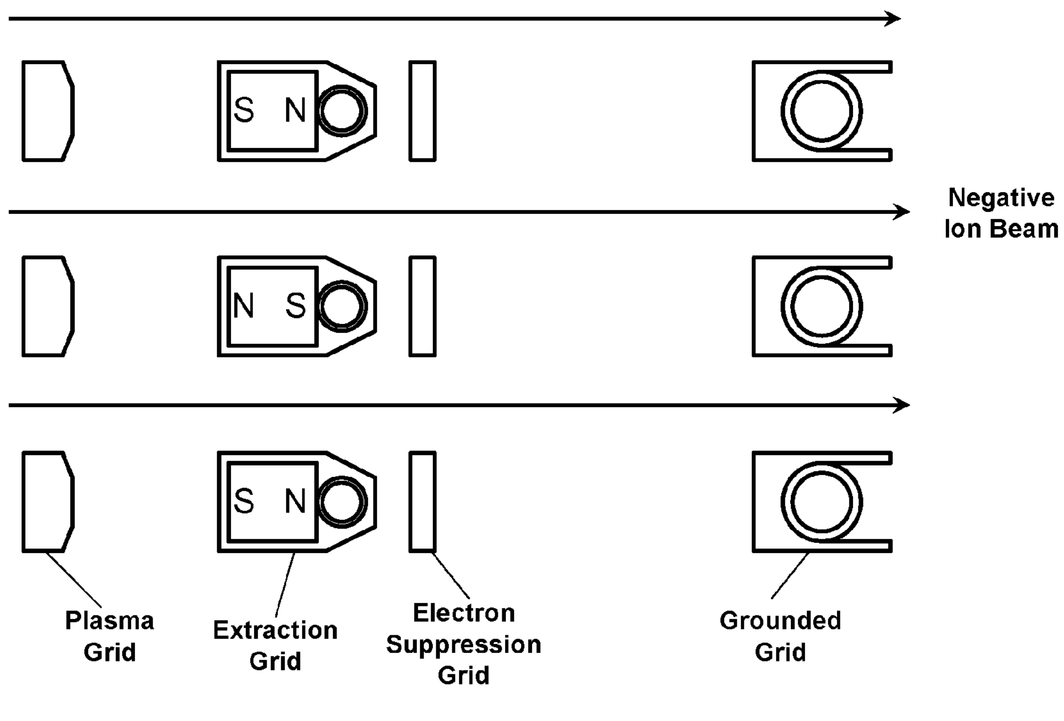
FIG. 7 is a schematic of a multi-aperture ion-optical system for the LHD source.
Figure 8A:
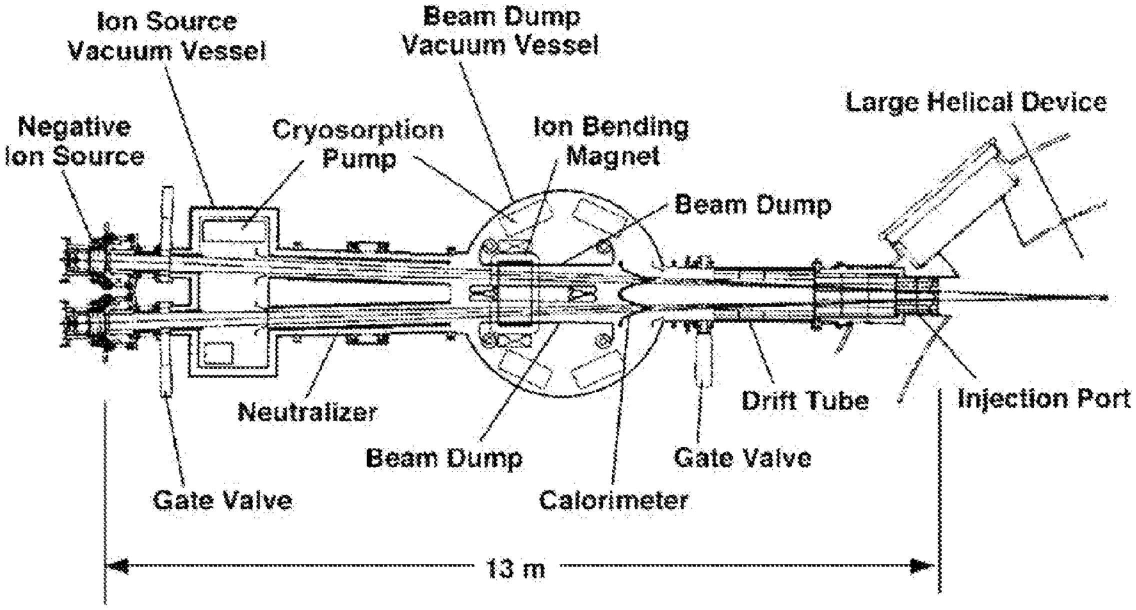
FIGS. 8A and 8B are top and side views of the LHD neutral beam injector.
Figure 8B:
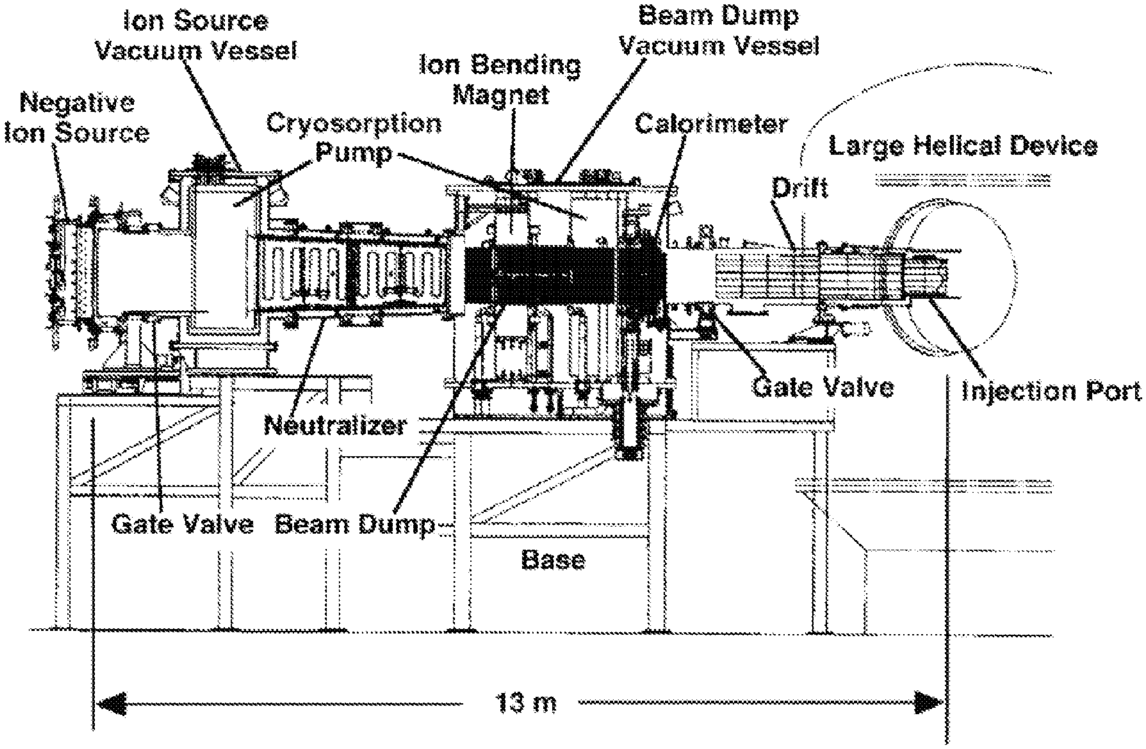

Embodiments provided herein are directed to a new negative ion-based neutral beam injector with energy of preferably about 500-1000 keV and high overall energetic efficiency. The preferred arrangement of an embodiment of a negative ion-based neutral beam injector 100 is illustrated in FIGS. 1 and 2. As depicted, the injector 100 includes an ion source 110, a gate valve 120, deflecting magnets 130 for deflecting a low energy beam line, an insulator-support 140, a high energy accelerator 150, a gate valve 160, a neutralizer tube (shown schematically) 170, a separating magnet (shown schematically) 180, a gate valve 190, pumping panels 200 and 202, a vacuum tank 210 (which is part of a vacuum vessel 250 discussed below), cryosorption pumps 220, and a triplet of quadrupole lenses 230. The injector 100, as noted, comprises an ion source 110, an accelerator 150 and a neutralizer 170 to produce about a 5 MW neutral beam with energy of about 0.50 to 1.0 MeV. The ion source 110 is located inside the vacuum tank 210 and produces a 9 A negative ion beam. The vacuum tank 210 is biased to −880 kV which is relative to ground and installed on insulating supports 140 inside a larger diameter tank 240 filled with $SF_6$ gas. The ions produced by the ion source are pre-accelerated to 120 keV before injection into the high energy accelerator 150 by an electrostatic multi aperture grid pre-accelerator 111 (see FIG. 9) in the ion source 110, which is used to extract ion beams from the plasma and accelerate to some fraction of the required beam energy. The 120 keV beam from the ion source 110 passes through a pair of deflecting magnets 130, which enable the beam to shift off axis before entering the high energy accelerator 150. The pumping panels 202 shown between the deflecting magnets 130 include a partition and cesium trap.

The gas efficiency of the ion source 110 is assumed to be about 30%. A projected negative ion beam current of 9-10 A corresponds to 6-7 l·Torr/s gas puff in the ion source 110. The neutral gas flowing from the ion source 110 builds up to an average pressure in the pre-accelerator 111 of about $2\times10^{-4}$ Torr. At this pressure, the neutral gas causes ~10% striping loss of the ion beam inside the pre-accelerator 111. Between the deflecting magnets 130 there are dumps (not shown) for neutral particles, which arise from the primary negative ion beam. There are also dumps (not shown) for positive ions back streaming from the high energy accelerator 150. A low energy beam transport line region 205 with differential pumping from pumping panels 200 is used immediately after pre-acceleration to decrease the gas pressure down to $\sim10^{-6}$ Torr before it reaches the high energy accelerator 150. This introduces an additional ~5%' beam loss, but since it happens at a low pre-acceleration energy the power loss is relatively small. The charge exchange losses in the high energy accelerator 150 are below 1% at the $10^{-6}$ Torr background pressure.

After acceleration to full energy of 1 MeV the beam enters a neutralizer 170 where it is partially converted into a neutral beam. The remaining ion species are separated by a magnet 180 and directed into electrostatic energy converters (not shown). The neutral beam passes through the gate valve 190 and enters a plasma chamber 270.

The vacuum vessel 250 is broken down into two sections. One section contains the pre-accelerator 111 and low energy beam line 205 in the first vacuum tank 210. Another section houses a high energy beam line 265, the neutralizer 170 and charged particles energy converters/recuperators in a second vacuum tank 255. The sections of the vacuum vessel 250 are connected through a chamber 260 with the high energy accelerator tube 150 inside.

The first vacuum tank 210 is the vacuum boundary of the pre-accelerator 111 and low energy beam line 205 and the larger diameter tank or outer vessel 240 is pressurized with $SF_6$ gas for high voltage insulation. The vacuum tanks 210 and 255 act as the support structure for the interior equipment, such as the magnets 130, cryosorption pumps 220, etc. Heat removal from the internal heat-bearing components will be accomplished with cooling tubes, which have to have insulation breaks in the case of the first vacuum tank 210, which is biased to −880 kV.

Figure 9:
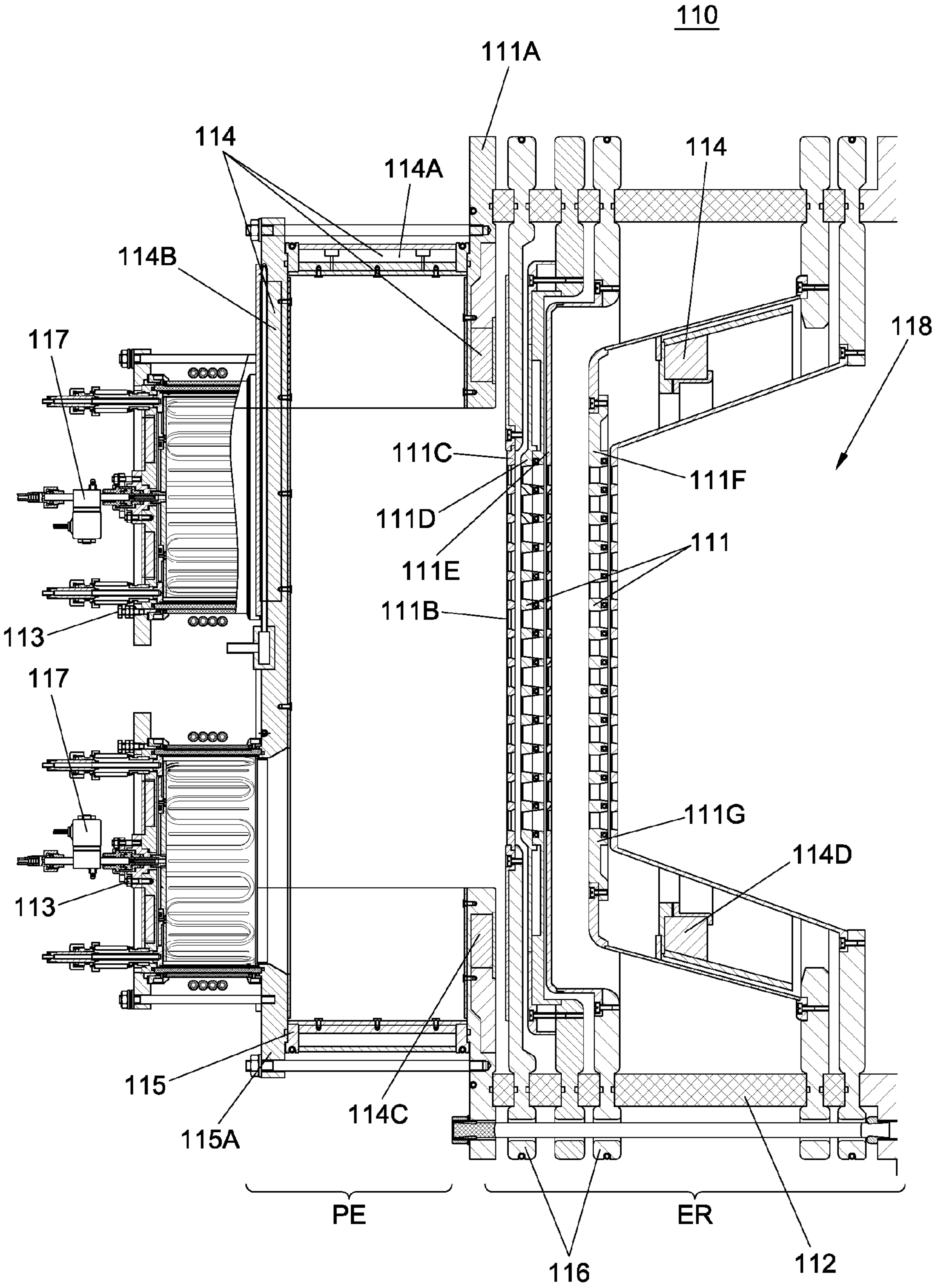
FIG. 9 is a sectional view of an ion source.

Ion Source:

A schematic diagram of the ion source 110 is shown in FIG. 9. The ion source includes: electrostatic multi-aperture pre-accelerator grids 111, ceramic insulators 112, RF-type plasma drivers 113, permanent magnets 114, a plasma box 115, water coolant channels and manifolds 116, and gas valves 117. In the ion source 110, a cesiated molybdenum surface of the plasma pre-accelerator grids 111 is used to convert the positive ions and neutral atoms formed by the plasma drivers 113 into negative ions in a plasma expansion volume (the volume between the drivers 113 and the grids 111, indicated by the bracket labeled "PE" in FIG. 9) with magnetic-multipole-bucket containment as provided by the permanent magnets 114.

A positive bias voltage for collection of the electrons to the plasma pre-accelerator grids 111 is applied to optimized conditions for negative ion production. Geometric shaping of apertures 111B in plasma pre-accelerator grids 111 is used to focus $H^-$ ions into the apertures 111B of the extraction grid. A small transverse magnetic filter produced by external permanent magnets 114 is used to decrease the temperature of electrons diffused from the driver region or plasma emitter region PE of plasma box 115 to the extraction region ER of the plasma box 115. Electrons in the plasma are reflected back from the extraction region ER by the small transverse magnetic filter field produced by external permanent magnets 114. The ions are accelerated to 120 keV before injection into the high energy accelerator 150 by the electrostatic multi-aperture pre-accelerator plasma grids 111 in the ion source 110. Before acceleration to high energy, the ion beam is about 35 cm in diameter. The ion source 110 therefore has to produce 26 mA/cm2 in the apertures 111B assuming 33% transparency in the pre-accelerator plasma grids 111.

Plasma, which feeds the plasma box 115, is produced by an array of plasma drivers 113 installed on a rear flange 115A of the plasma box, which is preferably a cylindrical water-cooled copper chamber (700 mm diameter by 170 mm long). The open end of the plasma box 115 is enclosed by the pre-accelerator plasma grids 111 of the extraction and acceleration system.

It is assumed that the negative ions are to be produced on the surface of the plasma grids 111, which are covered with a thin layer of cesium. Cesium is introduced into the plasma box 115 by use of a cesium supply system (not shown in FIG. 9).

The ion source 110 is surrounded by permanent magnets 114 to form a line cusp configuration for primary electron and plasma confinements. The magnet columns 114A on the cylindrical wall of the plasma box 115 are connected at the rear flange 115A by rows of magnets 114B that are also in a line-cusp configuration. A magnetic filter near the plane of the plasma grids 111 divides the plasma box 115 into the plasma emitter PE and the extraction region ER. The filter magnets 114C are installed at a flange 111A next to the plasma grids 111 to provide a transverse magnetic field (B=107 G at the center) which serves to prevent energetic primary electrons coming from the ion drivers 113 from reaching the extraction region ER. However, positive ions and low energy electrons can diffuse across the filter into the extraction region ER.

An electrode extraction and pre-acceleration system 111 comprises five electrodes 111C, 111D, 111E, 111F and 111G, each having 142 holes or apertures 111B formed orthogonal there through and used to provide a negative ion beam. The extraction apertures 111B are each 18 mm in diameter, so that total ion extraction area of the 142 extraction apertures is about 361 $cm^2$. The negative ion current density is 25 $mA/cm^2$ and is required to produce a 9 A ion beam. The magnetic field of the filter magnets 114C is extended into the gaps between the electrostatic extractor and pre-accelerator grids 111 to deflect co-extracted electrons onto grooves at the inner surface of the apertures 111B in the extracting electrodes 111C, 111D, and 111E. The magnetic field of the magnetic filter magnets 114C together with the magnetic field of additional magnets 114D provides the deflection and interception of the electrons, co-extracted with negative ions. The additional magnets 114D include an array of magnets installed between the holders of the accelerator electrodes 111F and 111G of the accelerator grid located downstream from the extracting grid comprising extracting electrodes 111C, 111D, and 111E. The third grid electrode 111E, which accelerates negative ions to an energy of 120 keV, is positively biased from the grounded grid electrode 111D to reflect back streaming positive ions entering the pre-accelerator grid.

The plasma drivers 113 include two alternatives, namely an RF plasma driver and an arc-discharge atomic driver. A BINP-developed arc-discharge arc plasma generator is used in the atomic driver. A feature of the arc-discharge plasma generator consists of the formation of a directed plasma jet. Ions in the expanding jet move without collisions and due to acceleration by drop of ambipolar plasma potential gain energies of ~5-20 eV. The plasma jet can be directed on to an inclined molybdenum or tantalum surface of the converter (see 320 in FIG. 10), wherein as the result of neutralization and reflection of the jet a stream of hydrogen atoms is produced. The energy of hydrogen atoms can be increased beyond an initial 5-20 eV by negative biasing of the converter relative to the plasma box 115. Experiments on obtaining intensive streams of atoms with such a converter were performed in the Budker Institute in 1982-1984.

Figure 10:
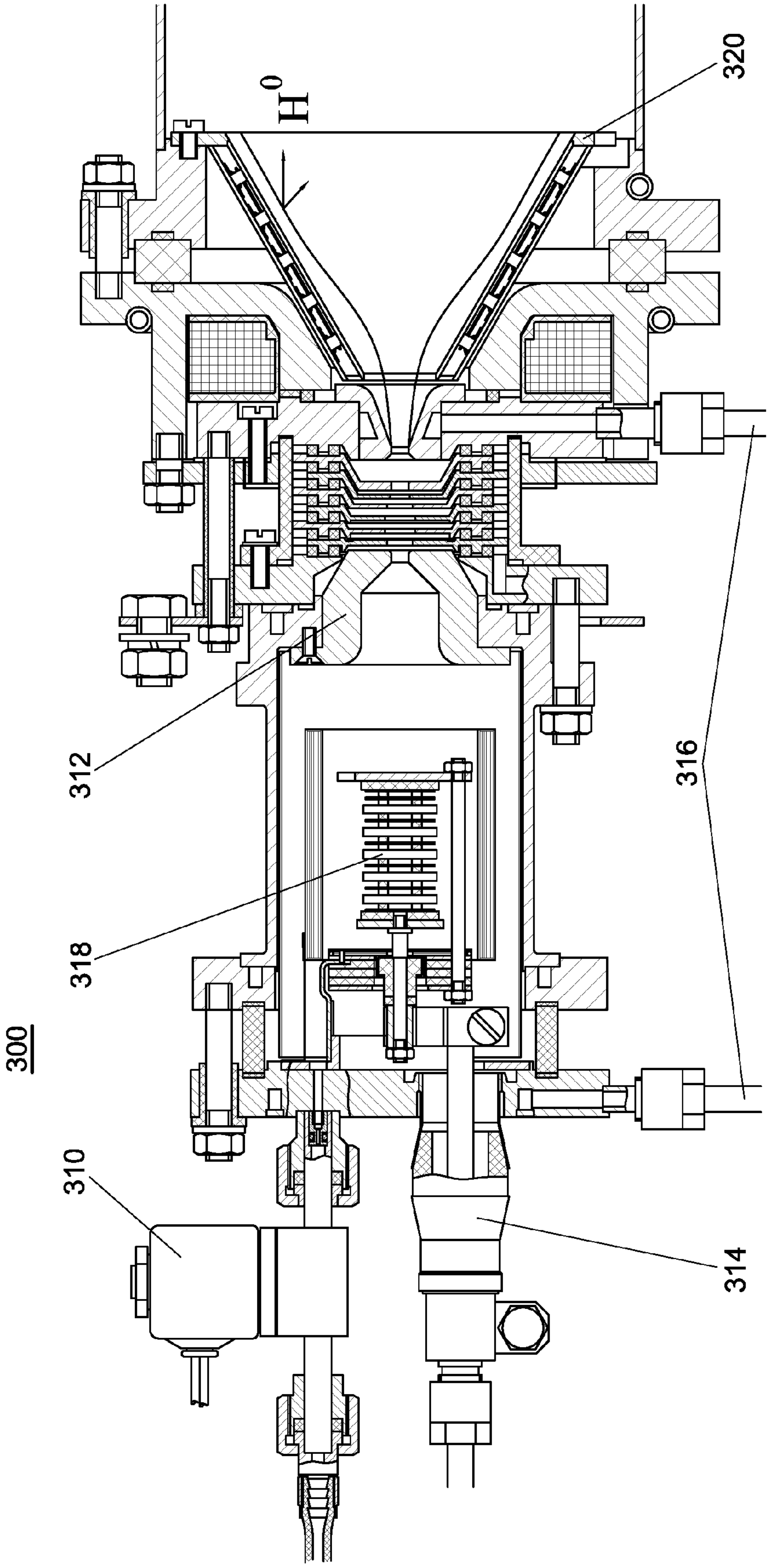
FIG. 10 is a sectional view of a low energy hydrogen atoms source.

In FIG. 10, the developed arrangement of a source of low energy atoms 300 is shown to include a gas valve 310, a cathode insert 312, an electrical feed through to a heater 314, cooling water manifolds 316, an LaB6 electron emitter 318, and an ion-atom converter 320. In experiments a stream of hydrogen atoms with an equivalent current of 20-25 A and energy varying in the range from 20 eV to 80 eV have been produced with an efficiency of more than 50%.

Such a source can be used in the negative ion source to supply atoms with energy optimized for efficient generation of negative ions on the cesiated surface of plasma grids 111.

Low Energy Beam Transport Line

Figure 11:
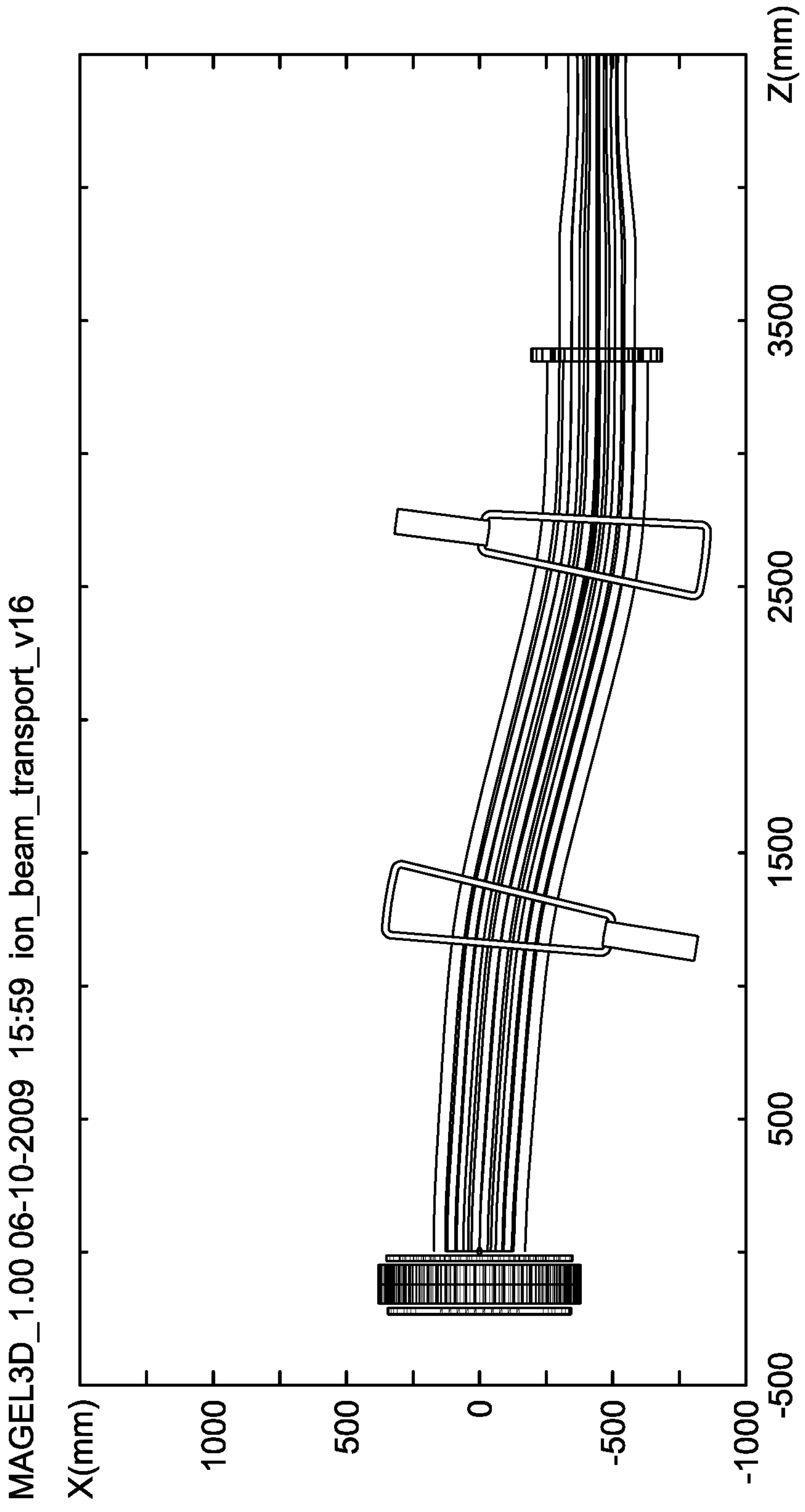
FIG. 11 is a graph showing the trajectories of $H^-$ ions in the low energy tract.

The H− ions generated and pre-accelerated to an energy of 120 keV by the ion source 110 on their passage along the low-energy beam transport line 205 are displaced perpendicular to their direction of motion by 440 mm with deviation by peripheral magnetic field of the ion source 110 and by a magnetic field of two special wedge-shaped bending magnets 130. This displacement of the negative ion beam in the low energy beam transport line 205 (as illustrated in FIG. 11) is provided to separate the ion source 110 and high-energy-accelerator regions 150. This displacement is used to avoid penetration of fast atoms originated from stripping of the $H^-$ beam on residual hydrogen in the accelerating tube 150, to reduce streams of cesium and hydrogen from the ion source 110 to the accelerating tube 150, and also for suppression of secondary ion flux from the accelerating tube 150 to the ion source 110. In FIG. 11 the calculated trajectories of the H− ions in the low-energy beam transport line are shown.

High Energy Beam Duct

Figure 12:
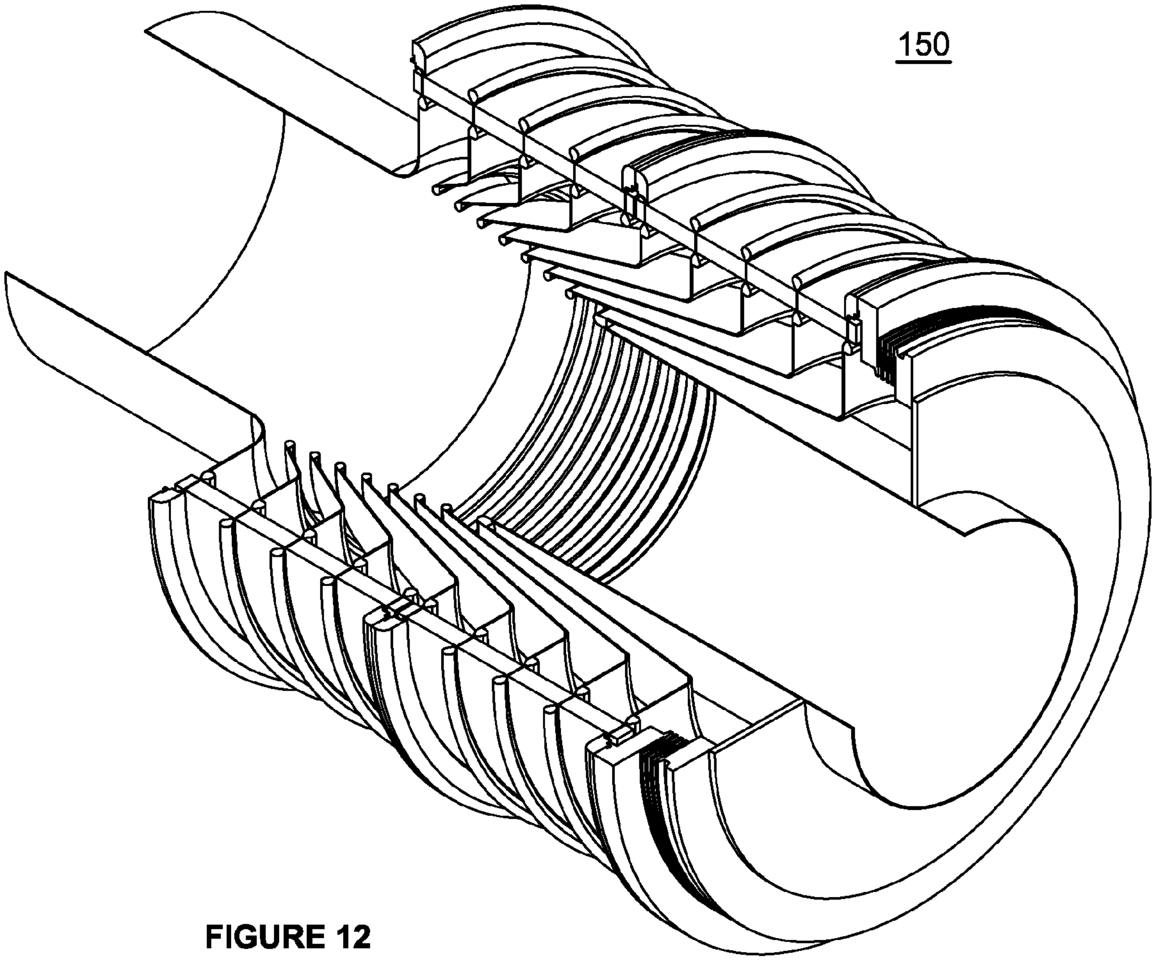
FIG. 12 is an isometric view of an accelerator.

The low energy beam outgoing from the low energy beam line enters a conventional electrostatic multi aperture accelerator 150 shown in FIG. 12.

Figure 13:
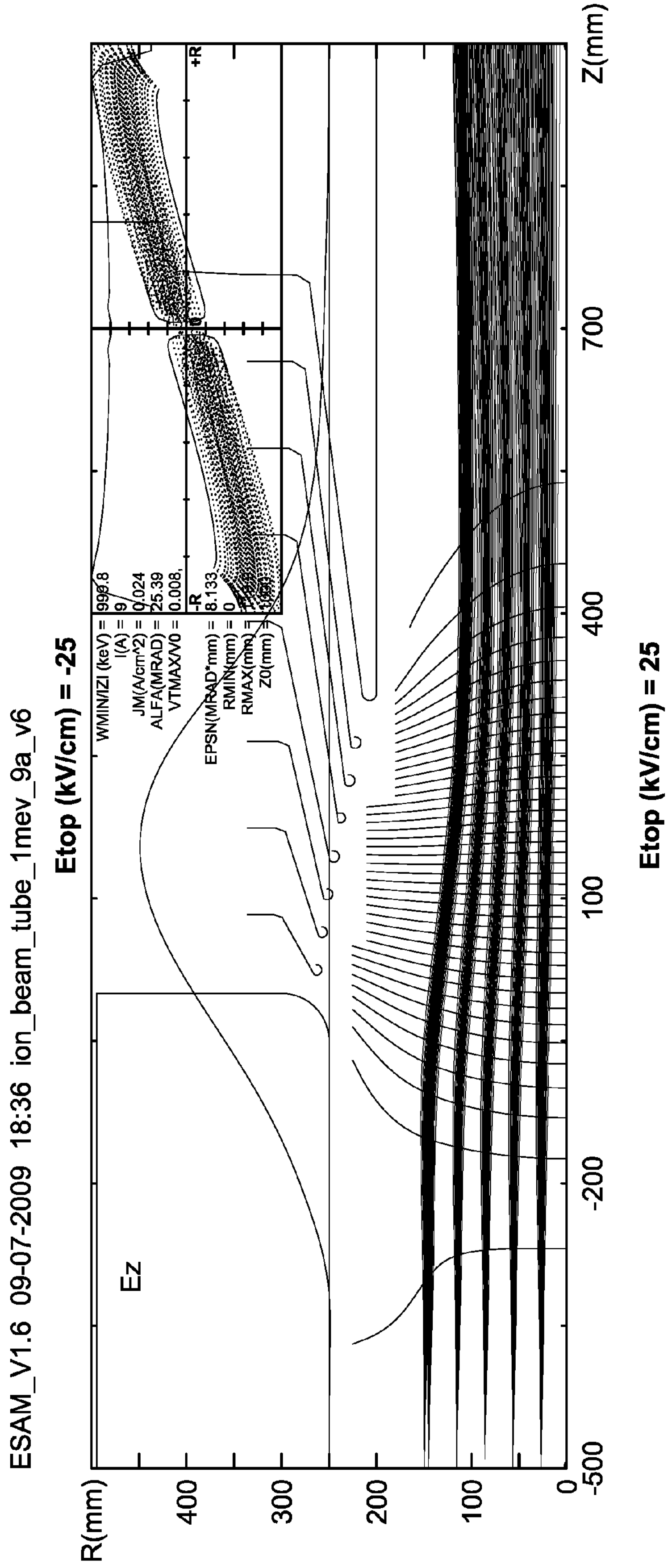
FIG. 13 is a graph showing the ion trajectories in the accelerating tube.

The results of the calculation of the 9 A negative-ion beam acceleration taking into account the space charge contribution are shown in FIG. 13. Ions are accelerated from a 120 keV energy up to 1 MeV. The accelerating potential on the tube 150 is 880 kV, and the potential step between the electrodes is 110 kV.

The calculation shows that the field strength does not exceed 50 kV/cm in the optimized accelerating tube 150 on electrodes in the zones of possible development of electron discharge.

Figure 14:
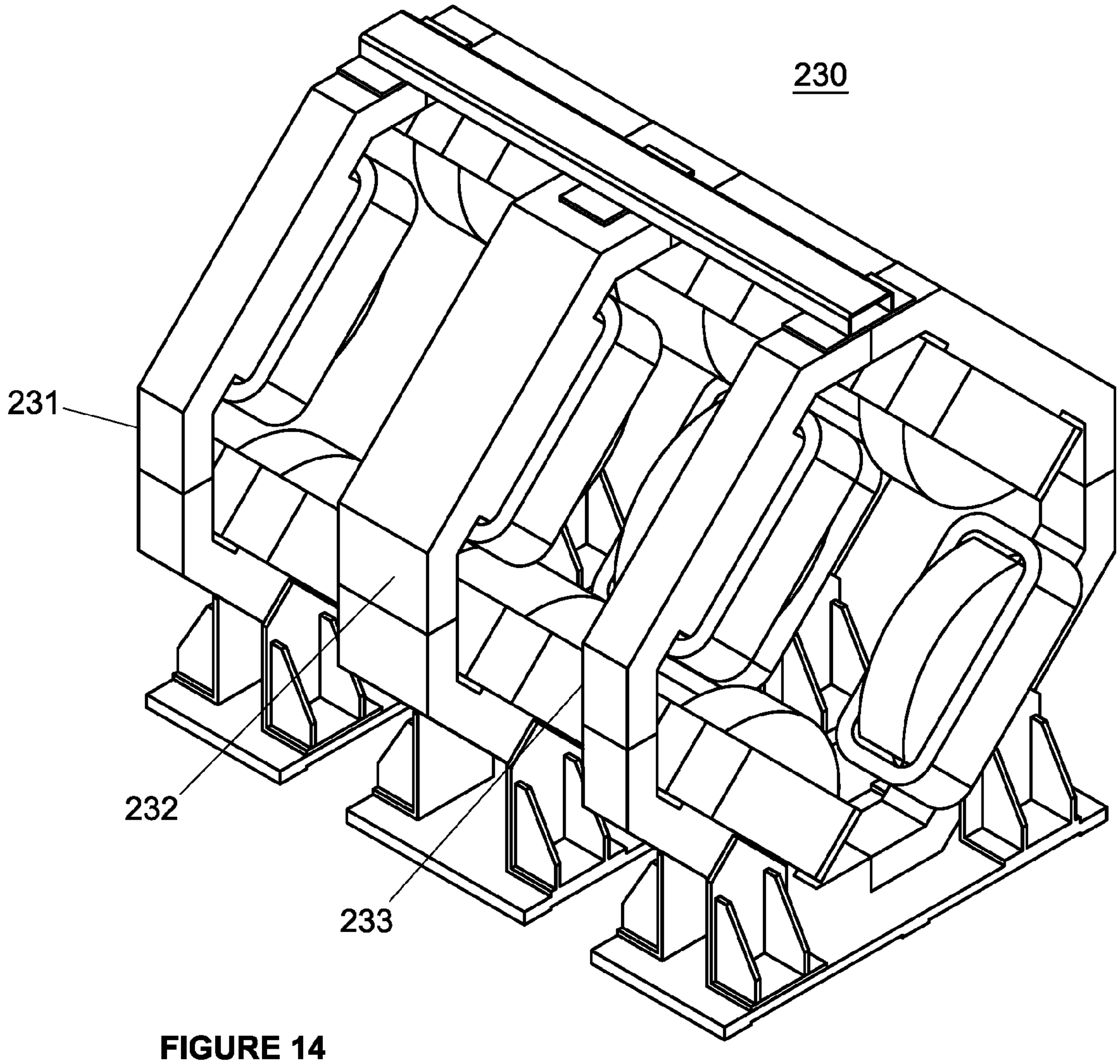
FIG. 14 is an isometric view of the triplet of quadrupole lenses.

After acceleration the beam goes through a triplet 230 of industry conventional quadrupole lenses 231, 232 and 233 (FIG. 14), which are used to compensate slight beam defocusing on the exit of accelerating tube 150 and to form a beam with a preferred size on the exit port. The triplet 230 is installed inside the vacuum tank 255 of the high energy beam transport line 265. Each of the quadrupole lenses 231, 232 and 233 include a conventional set of quadrupole electromagnets that produce customary magnetic focusing fields as are found in all modern conventional particle accelerators.

Figure 15:
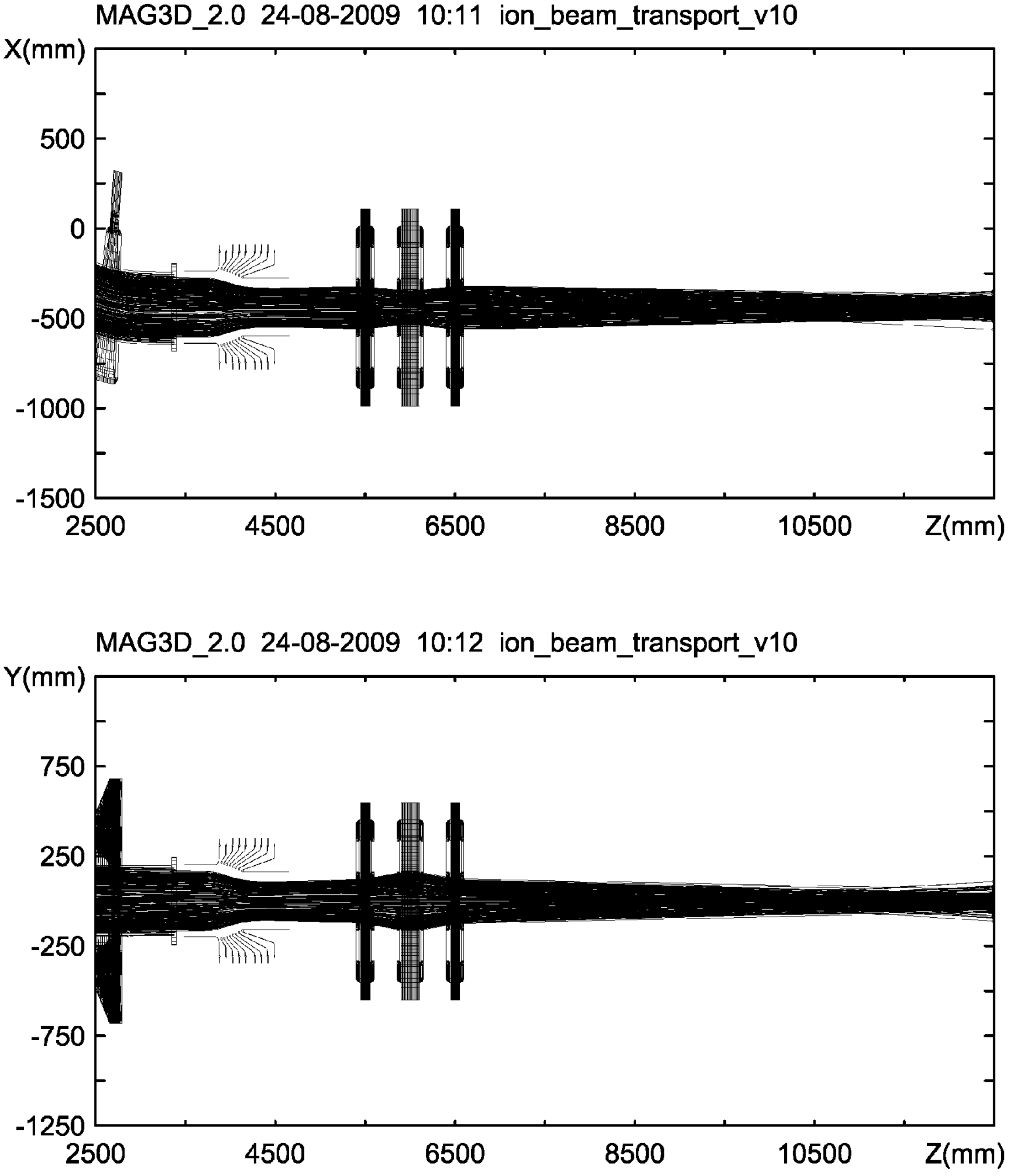
FIG. 15 is a graph showing a top view (a) and a side view (b) of the ion trajectories in an accelerator of a high energy beam transport line.

The calculated trajectories of a 9 A negative-ion beam with the transverse temperature of 12 eV in the accelerating tube 150, the quadrupole lenses 230 and the high energy beam transport line 265 are shown in FIG. 15. The calculation follows the beam beyond its focusing point.

The calculated diameter of the neutral beam with a 6 A equivalent current after the neutralizer at the distance of 12.5 m at half-height of the radial profile is 140 mm and 95% of the beam current is in a 180 mm diameter circumference.

Neutralization

The photodetachment neutralizer 170 selected for the beam system can achieve more than 95% stripping of the ion beam. The neutralizer 170 comprises an array of xenon lamps and a cylindrical light trap with highly reflective walls to provide the required photon density. Cooled mirrors with a reflectivity greater than 0.99 are used to accommodate a power flux on the walls of about 70 $kW/cm^2$. In an alternative, a plasma neutralizer using conventional technology could be used instead but with the expense of a slight decrease in efficiency. Nevertheless, ~85% neutralization efficiency of a plasma cell is quite sufficient if an energy recovery system has >95% efficiency, as predicted.

Figure 16:
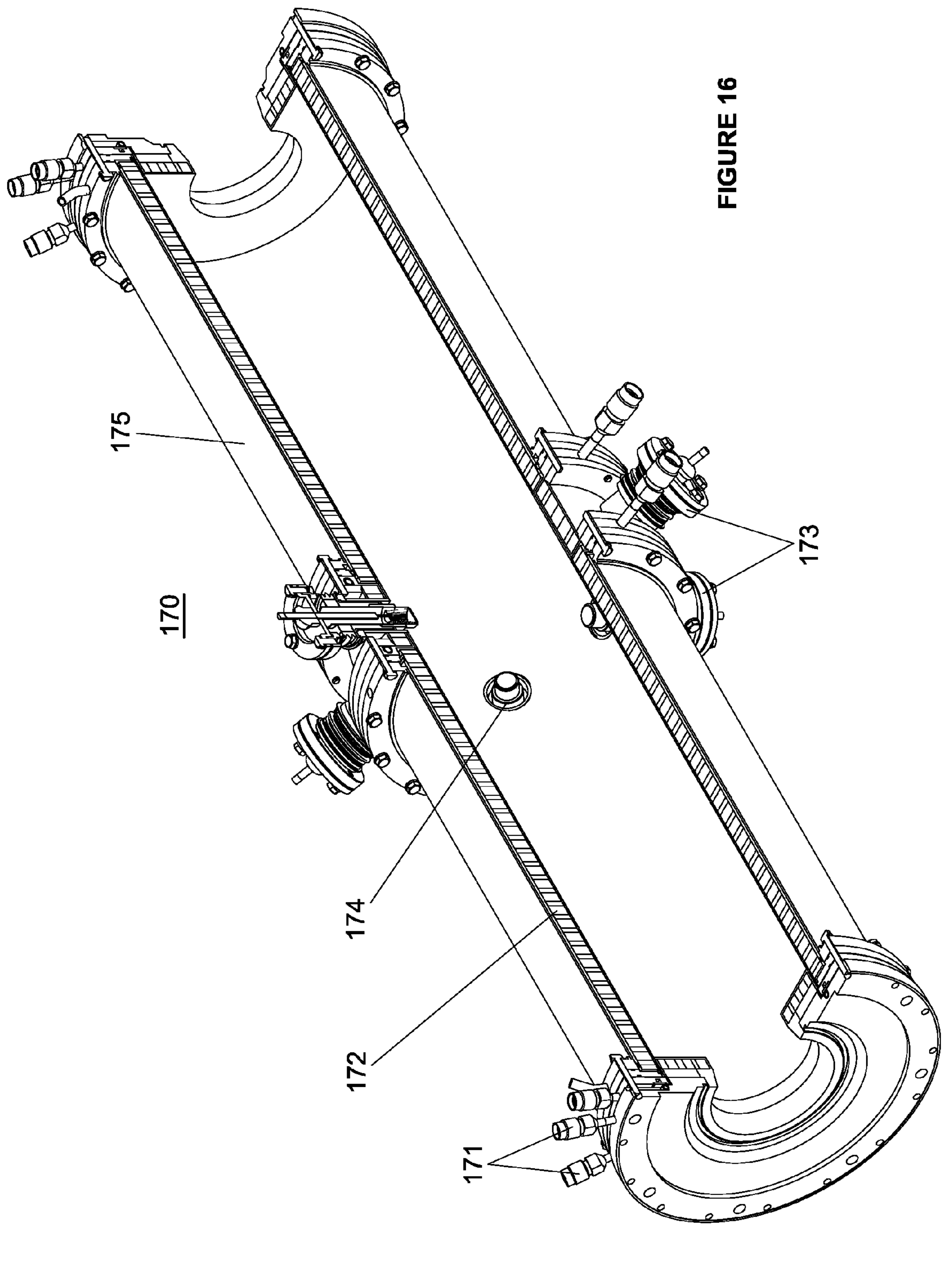
FIG. 16 is an isometric view of a plasma target arrangement.

The plasma neutralizer plasma is confined in a cylindrical chamber 175 with multi-pole magnetic field at the walls, which is produced by an array of permanent magnets 172. General view of the confinement device is shown in FIG. 16. The neutralizer 170 includes cooling water manifolds 171, permanent magnets 172, cathode assembles 173, and LaB6 cathodes 174.

The cylindrical chamber 175 is 1.5-2 m long and has openings at the ends for beam passing through. Plasma is generated by using several cathode assembles 173 installed at the center of the confinement chamber 175. Working gas is supplied near the center of the device 170. In the experiments with a prototype of such a plasma neutralizer 170, it was observed that confinement of electrons by the multi-pole magnetic fields 172 at the walls is good enough and considerably better than that of plasma ions. In order to equalize ion and electron losses, considerable negative potential develops in the plasma, so that the ions are effectively confined by the electric field.

Reasonably long plasma confinement results in relatively low power of the discharge required to sustain about $10^{13}$ $cm^{-3}$ plasma density in the neutralizer 170.

Energy Recuperation

There are objective reasons for achievement of high power efficiency in our conditions. First of all, these are: a relatively small current of the ion beam and low energy spread. In the scheme described herein, with the usage of plasma or vapor-metal targets, the residual current of ions can be expected to be ~3 A after the neutralizer. These streams of rejected ions with either positive or negative charge will be diverted via deflection magnet 180 to two energy recuperators, one each for positive and negative ions, respectively. Numerical simulations of the deceleration of these residual rejected ion beams with typically 1 MeV energy and 3 A in the direct converters inside the recuperators without a space-charge compensation have been carried out. The direct converter converts a substantial portion of the energy contained in the residual rejected ion beam directly to electricity and supplies the rest of the energy as high quality heat for incorporation in the thermal cycle. The direct converters follow the design of an electrostatic multi aperture decelerator, whereby consecutive sections of charged electrodes produce the longitudinal breaking fields and absorb the kinetic energy of the ions.

Figure 17:
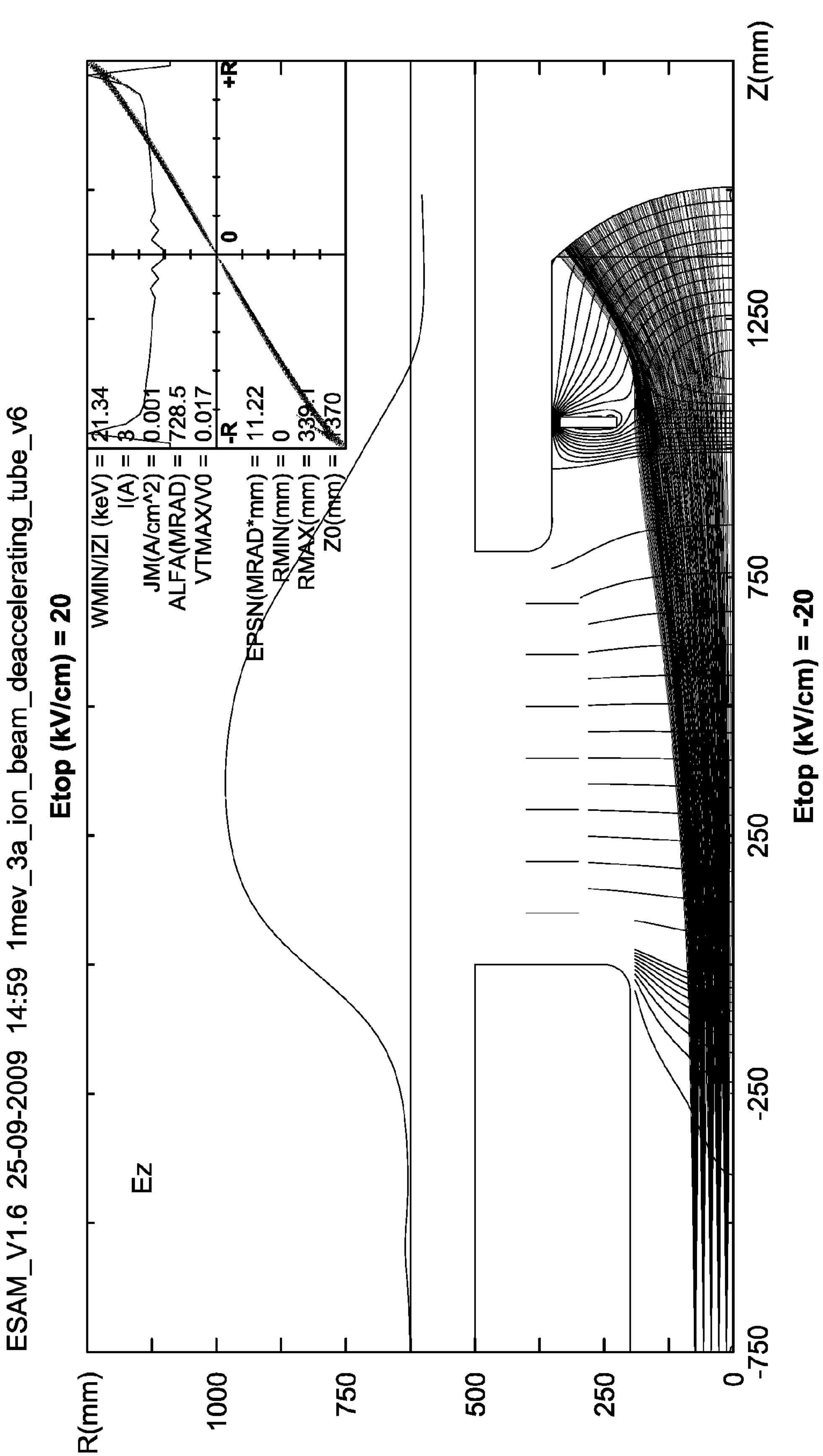
FIG. 17 is a graph showing results of two-dimensional calculations of ion beam deceleration in the recuperator.

FIG. 17 shows the results of two-dimensional calculations of ion beam deceleration in the converter. From the presented calculations, it follows that the deceleration of the ion beam with 1 MeV energy down to 30 keV energy is quite feasible, thus, the value of recuperation factor of 96-97% can be obtained.

Previous development attempts of high power neutral beam injectors based on negative ions have been analyzed to reveal critical issues so far preventing achievement of injectors with stable steady state operation of ~1 MeV and several MWs of power. Among those most important are:

- Control of cesium layer, and loss and re-deposition (temperature control, etc)
- Optimization of surface production of negative ions for extraction
- Separation of co-streaming electrons
- Non-homogeneity of ion current profile at plasma grid due to internal magnetic fields
- Low ion current density
- Accelerators are complicated and a lot of new technologies are still being developed (low voltage holding capacity, large insulators, etc)
- Back-streaming positive ions
- Advanced neutralizer technologies (plasma, photons) are not demonstrated at relevant conditions
- Energy conversion is not developed enough
- Beam blocking in the duct The innovative solutions to the problems provided herein can be grouped according to the system they are connected with, namely negative ion source, extraction/acceleration, neutralizer, energy convertors, etc.

1.0. Negative ion source 110:

1.1. Internal walls of a plasma box 115 and plasma drivers 113 stay at elevated temperature (150-200° C.) to prevent cesium accumulation on their surfaces. The elevated temperature:

- prevents uncontrolled cesium release due to desorption/sputtering and decreasing its penetration into the ion optical system (grids 111),
- reduces absorption and recombination of hydrogen atoms in cesium layer at the walls,
- reduces consumption and poisoning of cesium.

To achieve this, a high temperature fluid is circulated through all components. The temperature of the surfaces is further stabilized via active feed back control, i.e.: heat is either removed or added during CW operation and transient regimes. In contrast to this approach, all other existing and planned beam injectors use passive systems with water cooling and thermal breaks between the coolant tubes and the hot electrode bodies.

1.2. Cesium is supplied through a distributing manifold directly onto surface of the plasma grids 111, not to the plasma. Supplying cesium through a distributing manifold:

- provides controlled and distributed cesium supply during all beam-on time,
- prevents cesium shortage typically due to blocking by plasma,
- reduces cesium release from plasma after its accumulation and unblocking during long pulses.

In contrast, existing ion sources supply cesium directly into the discharge chamber.

2.0. Pre-accelerator (100-keV) 111:

2.1. A magnetic field used to deflect co-extracted electrons in the ion extraction and pre-acceleration regions is produced by external magnets, not by magnets embedded into the grid body, as adopted in previous designs:

- magnetic field lines in the high-voltage gaps between the grids are everywhere concaved towards the negatively biased grids, i.e. towards the plasma grid in the extraction gap and towards the extraction grid in the pre-accelerating gap. The concavity of magnetic field lines towards the negatively biased grids prevents the appearance of local Penning traps in the high-voltage gaps and the trapping/multiplying of co-extracted electrons, as it may happen in configurations with embedded magnets.

the electrodes of the ion optical system (IOS) (grids 111) without embedded "low-temperature" NIB magnets could be heated up to an elevated temperature (150-200° C.) and permits heat removal during long pulses by use of hot (100-150° C.) liquids.

the absence of embedded magnets saves the space between the emission apertures of the grids and permits the introduction of more efficient electrode heating/cooling channels.

In contrast, previous designs utilize magnets embedded into the grid body. This leads to the creation of static magneto-electric traps in the high voltage gaps that trap and multiply co-extracted electrons. This can cause a significant reduction in extracted beam current. It also prevents elevated temperature operation as well as appropriate heating/cooling performance, which is critical for long-pulse operation.

2.2. All of the electrodes of ion-optical system (grids 111) are always sustained at elevated temperature (150-200° C.) to prevent cesium accumulation at their surfaces and to increase the high-voltage strength of extracting and pre-accelerating gaps. In contrast, in conventional designs, the electrodes are cooled by water. The electrodes have elevated temperatures because there are thermal breaks between the coolant tubes and the electrode bodies, and there is no active feed back.

2.3. Initial warming up of the grids 111 at start up and heat removal during the beam-on phase is performed by running a hot liquid with a controllable temperature through the internal channels inside the grids 111.

2.4. Gas is additionally pumped out from the pre-accelerating gap through the side space and large openings in the grid holders in order to decrease gas pressure along beam line and to suppress negative ions stripping and production/multiplying of secondary particles in the gaps.

2.5. The inclusion of positively biased grids 111 is used to repel back streaming positive ions.

3.0. High voltage (1 MeV) accelerator 150:

3.1. The high voltage accelerator 150 is not coupled directly to the ion source, but is spaced apart from the ion source by a transition zone (low energy beam transport line—LEBT 205) with bending magnets 130, vacuum pumps and cesium traps. The transition zone:

intercepts and removes most of the co-streaming particles including electrons, photons and neutrals from the beam, pumps out gas emanating from the ion source 110 and prevents it from reaching the high-voltage accelerator 150, prevents cesium from flowing out of the ion source 110 and penetrating to the high-voltage accelerator 150, prevents electrons and neutrals, produced by negative ions stripping, from entering the high-voltage accelerator 150.

In the previous designs, the ion source is directly connected to the high-voltage accelerator. This causes the high-voltage accelerator to be subject to all gas, charged particle, and cesium flows from the ion source and vice versa. This strong interference reduces the voltage holding capacity of the high-voltage accelerator.

3.2. Bending magnets 130 in the LEBT 205 deflect and focus the beam onto the accelerator axis. The bending magnets 130:

compensate any beam offset and deflection during transport through the magnetic field of the ion source 110, offset between the axes of pre and high-voltage accelerators 111 and 150 reduces the influx of co-streaming particles to the high-voltage accelerator 150 and prevents the highly accelerated particles from back-streaming (positive ions and neutrals) into the pre-accelerator 111 and ion source 110.

In contrast, previous systems have no physical separation between acceleration stages and, therefore, do not allow for axial offsets as featured herein.

3.3. The magnets of the low energy beam line 205 focus the beam into the entrance of the single aperture accelerator 150:

Beam focusing facilitates homogeneity of the beam entering the accelerator 150 compared to the multi-aperture grid systems.

3.4. Application of a single aperture accelerator:

simplifies system alignment and beam focusing facilitate gas pumping and secondary particle removal from high energy accelerator 150 reduces beam losses onto the electrodes of high energy accelerator 150.

3.5. Magnetic lenses 230 are used after acceleration to compensate for over focusing in the accelerator 150 and to form a quasi-parallel beam.

In the conventional designs, there are no means for beam focusing and deflection, except in the accelerator itself.

4.0. Neutralizer 170:

4.1. Plasma neutralizer based on a multi-cusp plasma confinement system with high field permanent magnets at the walls;

increases neutralization efficiency, minimizes overall neutral beam injector losses.

These technologies have never been considered for application in large-scale neutral beam injectors.

4.2. Photon neutralizer—photon trap based on a cylindrical cavity with highly reflective walls and pumping with high efficiency lasers.

further increases neutralization efficiency, further minimizes overall neutral beam injector losses.

These technologies have never been considered for application in large-scale neutral beam injectors.

5.0. Recuperators:

5.1. Application of residual ion energy recuperator(s):

increases overall efficiency of the injector.

In contrast, recuperation is not foreseen in conventional designs at all.

REFERENCES

[1.] L. W. Alvarez, Rev. Sci. Instrum. 22, 705 (1951)

[2.] R. Hemsworth et al. Rev. Sc. Instrum., Vol. 67, p. 1120 (1996)

[3.] Capitelli M. and Gorse C. IEEE Trans on Plasma Sci, 33, N. 6, p. 1832-1844 (2005)

[4.] Hemsworth R. S., Inoue T., IEEE Trans on Plasma Sci, 33, N. 6, p. 1799-1813 (2005)

[5.] B. Rasser, J. van Wunnik and J. Los Surf. Sci. 118 (1982), p. 697 (1982)

[6.] Y. Okumura, H. Hanada, T. Inoue et al. AIP Conf. Proceedings #210, NY, p. 169-183(1990)

[7.] O. Kaneko, Y. Takeiri, K. Tsumori, Y. Oka, and M. Osakabe et al., "Engineering prospects of negative-ion-based neutral beam injection system from high power operation for the large helical device," Nucl. Fus., vol. 43, pp. 692-699, 2003

While the invention is susceptible to various modifications, and alternative forms, specific examples thereof have been shown in the drawings and are herein described in detail. All references are specifically incorporated herein in their entirety. It should be understood, however, that the invention is not to be limited to the particular forms or methods disclosed, but to the contrary, the invention is to cover all modifications, equivalents and alternatives falling within the spirit and scope of the appended claims.

What is claimed is:

1. A negative ion-based beam injector comprises an ion source configured to produce a negative ion beam, wherein the ion source includes a plasma box, wherein internal walls of the plasma box are maintainable at elevated temperatures of about 150-200° C., a pre-accelerator, and a high energy accelerator interconnected to and spaced apart from the pre-accelerator and ion source.

2. The injector of claim 1, wherein the pre-accelerator is an electrostatic multi aperture grid in the ion source.

3. The injector of claim 2, further comprising a distributing manifold for directly supplying cesium on the multi aperture grid of the pre-accelerator.

4. The injector of claim 2, wherein the multi aperture grid is positively biased to repel back streaming positive ions.

5. The injector of claim 1, further comprising a pair of deflecting magnets interposing the pre-accelerator and high energy accelerator, wherein the pair of deflecting magnets enables a beam from the pre-accelerator to shift off axis before entering the high energy accelerator.

6. The injector of claim 1, wherein the pre-accelerator includes external magnets to deflect co-extracted electrons in an ion extraction and pre-acceleration regions.

7. The injector of claim 1, further comprising a pumping system to pump gas out from a pre-acceleration gap.

8. The injector of claim 1, wherein the high energy accelerator is spaced apart from the ion source by a transition zone comprising a low energy beam transport line.

9. The injector of claim 8, wherein the low energy beam transport line includes cesium traps.

10. The injector of claim 9, wherein the low energy beam transport line includes bending magnets that deflect and focus the beam onto the axis of the high energy accelerator.

11. The injector of claim 1, further comprising a neutralizer interconnected to the high energy accelerator.

12. A negative ion-based beam injector comprises an ion source adapted to produce a negative ion beam, a pre-accelerator coupled to the ion source, a high energy accelerator, and a pair of deflecting magnets, interposing the pre-accelerator and high energy accelerator, wherein the pair of deflecting magnets enables a beam from the pre-accelerator to shift off axis before entering the high energy accelerator.

13. The injector of claim 12, further comprising a plurality of magnets externally coupled to the pre-accelerator to deflect co-extracted electrons in an ion extraction and pre-acceleration regions.

14. The injector of claim 12, wherein the ion source includes a plasma box having internal walls maintainable at elevated temperatures of about 150-200° C.

15. The injector of claim 12, wherein the pre-accelerator comprises an electrostatic multi aperture grid.

16. The injector of claim 15, the further comprising a distributing manifold for directly supplying cesium on the electrostatic multi aperture grid.

17. The injector of claim 12, wherein the pre-accelerator comprises external magnets to deflect co-extracted electrons in an ion extraction and pre-acceleration regions.

18. The injector of claim 12, further comprising cesium traps interposing the pre-accelerator and the high energy accelerator.

19. The injector of claim 12, further comprising a residual ion energy recuperator.

20. The injector of claim 12, further comprising a neutralizer coupled to the high energy accelerator.

21. The injector of claim 20, wherein the neutralizer includes a plasma neutralizer comprising a multi-cusp plasma confinement system with high field permanent magnets.

22. The injector of claim 20, wherein the neutralizer includes a photon neutralizer comprising a cylindrical cavity with reflective walls.

* * * * *